US008329541B2

(12) United States Patent
Ye et al.

(10) Patent No.: US 8,329,541 B2
(45) Date of Patent: Dec. 11, 2012

(54) INP-BASED TRANSISTOR FABRICATION

(75) Inventors: Peide Ye, West Lafayette, IN (US); Zhiyuan Cheng, Lincoln, MA (US); Yi Xuan, West Lafayette, IN (US); Yanqing Wu, West Lafayette, IN (US); Bunmi Adekore, Medford, MA (US); James Fiorenza, Wilmington, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 886 days.

(21) Appl. No.: 12/139,010

(22) Filed: Jun. 13, 2008

(65) Prior Publication Data
US 2009/0042344 A1 Feb. 12, 2009

Related U.S. Application Data

(60) Provisional application No. 60/934,716, filed on Jun. 15, 2007.

(51) Int. Cl.
*H01L 21/336* (2006.01)

(52) U.S. Cl. ........ 438/285; 438/172; 438/492; 438/504; 438/508; 257/E21.11; 257/E21.112; 257/E21.127; 257/E21.403; 257/E21.409

(58) Field of Classification Search .......... 438/167, 438/172, 285, 492, 504, 508; 257/190, 615, 257/617, E21.403, E21.409, E29.107
See application file for complete search history.

(56) References Cited

U.S. PATENT DOCUMENTS

| | | | |
|---|---|---|---|
| 4,307,510 A | 12/1981 | Sawyer et al. | |
| 4,322,253 A | 3/1982 | Pankove et al. | |
| 4,370,510 A | 1/1983 | Stirn | |
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi | |
| 4,789,643 A | 12/1988 | Kajikawa | |
| 4,826,784 A | 5/1989 | Salerno et al. | |
| 4,860,081 A | 8/1989 | Cogan | |
| 4,876,210 A | 10/1989 | Barnett et al. | |
| 4,948,456 A | 8/1990 | Schubert | |
| 4,963,508 A | 10/1990 | Umeno et al. | |
| 5,032,893 A | 7/1991 | Fitzgerald et al. | |
| 5,034,337 A | 7/1991 | Mosher et al. | |

(Continued)

FOREIGN PATENT DOCUMENTS

CN 2550906 5/2003

(Continued)

OTHER PUBLICATIONS

Epitaxial Lateral Overgrowth of GaAs on a Si Substrate, 28 Jap. J. App. Physics 3, pp. L337-L339 (Mar. 1989).

(Continued)

*Primary Examiner* — Mary Wilczewski
*Assistant Examiner* — Toniae Thomas
(74) *Attorney, Agent, or Firm* — Slater & Matsil, L.L.P.

(57) ABSTRACT

Methods of forming structures that include InP-based materials, such as a transistor operating as an inversion-type, enhancement-mode device. A dielectric layer may be deposited by ALD over a semiconductor layer including In and P. A channel layer may be formed above a buffer layer having a lattice constant similar to a lattice constant of InP, the buffer layer being formed over a substrate having a lattice constant different from a lattice constant of InP.

16 Claims, 8 Drawing Sheets

U.S. PATENT DOCUMENTS

| | | |
|---|---|---|
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura et al. |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van der Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van der Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |

| Patent No. | Date | Inventor(s) |
|---|---|---|
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Leong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |

| | | |
|---|---|---|
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen et al. |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1* | 12/2009 | Park ............................ 257/615 |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1* | 8/2010 | Lochtefeld ................. 257/190 |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10017137 | 10/2000 |
| DE | 103 20 160 A1 | 8/2004 |
| EP | 0352472 | 6/1989 |
| EP | 0 600 276 | 6/1994 |
| EP | 0817096 | 1/1998 |
| EP | 1 551 063 | 7/2005 |
| EP | 1 796 180 | 6/2007 |
| GB | 2215514 | 9/1989 |
| JP | 2-062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000-286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004-200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO 0072383 | 11/2000 |
| WO | WO 0101465 | 1/2001 |
| WO | WO 0209187 | 1/2002 |
| WO | WO 02/086952 | 10/2002 |
| WO | WO 02088834 | 11/2002 |
| WO | WO 03073517 | 9/2003 |
| WO | WO 2004004927 | 1/2004 |
| WO | WO 2004/023536 | 3/2004 |
| WO | WO 2005/013375 | 2/2005 |
| WO | WO 2005/048330 | 5/2005 |
| WO | WO 2005098963 | 10/2005 |
| WO | WO 2005/122267 | 12/2005 |
| WO | WO 2006025407 | 3/2006 |
| WO | WO 2006/125040 | 11/2006 |
| WO | WO 2008124154 | 10/2008 |

OTHER PUBLICATIONS

68 Applied Physics Letters 7, pp. 774-779 (1999).
Asano, T. et al., "AlGaInN laser diodes grown on an ELO-GaN substrate vs. on a sapphire substrate," *2000 IEEE Semiconductor Laser Conference, Conference Digest*, pp. 109-110.

Ashby, C.I.H. et al., "Low-dislocation-density GaN from a single growth on a textured substrate." Applied Physics Letters, v 77, n 20, Nov. 13, 2000, pp. 3233-3235.
Ashley et al., "Heternogeneous InSb Quantum Well Transistors on Silicon for ultra-high speed, low power logic applications," 43 Electronics Letters 14 (Jul. 2007).
Bai et al, "Study of the defect elimination mechanisms in aspect ratio trapping Ge growth," Appl. Phys. Letters, vol. 90 (2007).
Bakkers et al., "Epitaxial Growth on InP Nanowires on Germanium," Nature Materials, vol. 3 (Nov. 2004), pp. 769-773.
Baron et al., "Chemical Vapor Deposition of Ge Nanocrystals on $SiO_2$," Applied Physics Letters, vol. 83, No. 7 (Aug. 18, 2003), pp. 1444-1446.
Bean et al., "$Ge_xSi1-x/Si$ strained-later superlattice grown by molecular beam epitaxy," J. Vac. Sci. Tech. A (2)2, pp. 436-440 (1984).
Beckett et al., "Towards a reconfigurable nanocomputer platform," ACM Int'l. Conf. Proceeding Series, vol. 19, pp. 141-150 (2002).
Beltz et al., "A Theoretical Model for Threading Dislocation Reduction During Selective Area Growth," Materials Science and Engineering, A234-236 (1997), pp. 794-797.
Bergman et al. "RTD/CMOS Nanoelectronic Circuits: Thin-Film InP-based Resonant Tunneling Diodes Integrated with CMOS circuits," 20 Electron Device Letters 3, pp. 119-122 (1999).
Blakeslee, "The Use of Superlattices to Block the Propogation of Dislocations in Semiconductors," Mat. Res. Soc. Symp. Proc. 148, pp. 217-227.
Borland, J.O., "Novel device structures by selective epitaxial growth (SEG)," 1987 International Electron Devices Meeting pp. 12-15.
Bryskiewicz, T., "Dislocation filtering in SiGe and InGaAs buffer layers grown by selective lateral overgrowth method," Applied Physics Letters, v 66, n 10, Mar. 6, 1995, pp. 1237-1239.
Bushroa, A.R. et al., "Lateral epitaxial overgrowth and reduction in defect density of 3C-SiC on patterned Si substrates," Journal of Crystal Growth, v 271, Oct. 15, 2004, pp. 200-206.
Cannon et al., "Monolithic Si-based Technology for Optical Receiver Circuits," Proceedings of SPIE, vol. 4999 (2003), pp. 145-155.
Chan et al., "Influence of metalorganic Sources on the Composition Uniformity of Selectively Grown $Ga_xIn_{1-x}P$," Jpn J. Appl. Phys., vol. 33 (1994) pp. 4812-4819.
Chang et al., "Epitaxial Lateral Overgrowth of Wide Dislocation-Free GaAs on Si Substrates," Electrochemical Soc'y Proceedings, vol. 97-21, pp. 196-200.
Chang, Y.S. et al., "Effect of growth temperature on epitaxial lateral overgrowth of GaAs on Si substrate," Journal of Crystal Growth 174, Apr. 1997, p. 630-34.
Chau et al., "Opportunities and Challenges of III-V Nanoelectronics for Future High-Speed, Low Power Logic Applications," IEEE CSIC Digest, pp. 17-20 (2005).
Chen, Y. et al., "Dislocation reduction in GaN thin films via lateral overgrowth from trenches," Applied Physics Letters, v 75, n 14, Oct. 4, 1999, pp. 2062-2063.
Choi et al., "Monolithic Integration of Si MOSFET's and GaAs MESFET's," Electron Device Letters, v. EDL-7, No. 4 (1986).
Choi et al., "Monolithic Integration of GaAs/AlGaAs Double-Heterostructure LED's and Si MOSFET's," Electon Device Letters, v. EDL-7, No. 9 (1986).
Choi et al., "Monolithic Integration of GaAs/AlGaAs LED and Si Driver Circuit," 9 Electron Device Letters 10 (1988).
Cloutier et al., "Optical gain and stimulated emission in periodic nanopatterned crystalline silicon," Nature Materials, Nov. 2005.
Currie et al., "Carrier Mobilities and Process Stability of Strained Si n- and p-MOSFETs on SiGe Virtual Substrates," J. Vac. Sci. Tech. B 19(6), pp. 2268-2279 (2001).
Partial International Search for International Application No. PCT/US2006/033859, 7 pages.
Dadgar et al., "MOVPE Growth of GaN on Si (111) Substrates," Journal of Crystal Growth, 248 (2003) pp. 556-562.
Datta et al., "Silicon and III-V Nanoelectronics," IEEE Int'l. Conf. on Indium Phosphide & Related Mat., pp. 7-8 (2005).
Datta et al., "Ultrahigh-Speed 0.5 V Supply Voltage $In_{0.7}Ga_{0.3}As$ Quantum-Well Transistors on Silicon Substrate," 28 Electron Device Letters 8, pp. 685-687 (2007).

Davis, R.F. et al., "Lateral epitaxial overgrowth of and defect reduction in GaN thin films," 1998 IEEE Lasers and Electro-Optics Society Annual Meeting, pp. 360-361.
de Boeck et al., "The fabrication on a novel composite $GaAs/SiO_2$ nucleation layer on silicon for heteroepitaxial overgrowth by molecular beam epitaxy," Mat. Sci. and Engineering, B9 (1991), pp. 137-141.
Donaton et al., "Design and Fabrication of MOSFETs with a Reverse Embedded SiGe (Rev. e-SiGe) Structure," 2006 IEDM, pp. 465-468.
Dong-Ho Kim et al., "GaN nano epitaxial lateral overgrowth on holographically patterned substrates," 2003 International Symposium on Compound Semiconductors, pp. 27-28.
Examination Report in European Patent Application No. 06800414.2, mailed Mar. 5, 2009 (3 pages).
Fang et al., "Electrically pumped hybrid AlGaInAs-silicon evanescent laser," 14 Optics Express 20, pp. 9203-9210 (2006).
Feltin, E. et al., "Epitaxial lateral overgrowth of GaN on Si (111)," Journal of Applied Physics, v 93, n 1, Jan. 1, 2003, p. 182-5.
Feng et al., "Integration of Germanium-on-Insulator and Silicon MOSFETs on a Silicon Substrate," 27 Electron Device Letters 11, pp. 911-913 (2006).
Fiorenza et al., "Film Thickness Constraints for Manufacturable Strained Silicon CMOS," 19 Semiconductor Sci. Technol., pp. L4 (2004).
Fischer et al., "Elastic stress relaxation in SiGe epilayers on patterned Si substrates," 75 Journal of Applied Physics 1, pp. 657-659 (1994).
Fischer et al., "State of stress and critical thickness of Strained small-area SiGe layers," Phys. Stat. Sol. (a) 171, pp. 475-485 (1999).
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9 (1990), pp. 949-955.
Fitzgerald et al., "Epitaxial Necking in GaAs Grown on Pre-patterned Si Substrates," Journal of Electronic Materials, vol. 20, No. 10 (1991), pp. 839-853.
Fitzgerald et al., "Nucleation Mechanisms and the Elimination of Misfit Dislocations at Mismatched Interfaces by Reduction in Growth Area," J. Applied Phys., vol. 65, No. 6, (Mar. 15, 1989), pp. 2220-2237.
Fitzgerald, "The Effect of Substrate Growth Area on Misfit and Threading Dislocation Densities in Mismatched Heterostructures," J. Vac. Sci. Technol. B, vol. 7, No. 4 (Jul./Aug. 1989), pp. 782-788.
Fitzgerald et al., "Structure and recombination in InGaAs/GaAs heterostructures," 63 Journal of Applied Physics 3, pp. 693-703 (1988).
Fitzgerald et al., "Totally relaxed $Ge_xSi_{1-x}$ layers with low threading dislocation densities grown on Si Substrates," 59 Applied Physics Letters 7, pp. 811-813 (1991).
Gallagher et al., "Development of the magnetic tunnel junction MRAM at IBM: From first junctions to a 16-Mb MRAM demonstrator chip," 50 IBM J. Research & Dev. 1 (2006).
Gallas et al, "Influence of Doping on Facet Formation at the $SiO_2/Si$ Interface," Surface Sci. 440, pp. 41-48 (1999).
Geppert, L., "Quantum transistors: toward nanoelectronics," IEEE Spectrum, pp. 46-51 (Sep. 2000).
Gibbon et al., "Selective-area low-pressure MOCVD of GaInAsP and related materials on planar InP substrates" Semicond Sci Tech. 8, pp. 998-1010 (1993).
Glew et al., "New DFB grating structure using dopant-induced refractive index step," J. Crystal Growth 261 (2004) pp. 349-354.
Groenert et al., "Monolithic integration of room-temperature cw GaAs/AlGaAs lasers on Si substrates via relaxed graded GeSi buffer layers," 93 J. Appl. Phys. 362 (2003).
Gustafsson et al., "Cathodoluminescence from relaxed $Ge_xSi_{1-x}$ grown by heteroepitaxial lateral overgrowth," J. Crystal Growth 141 (1994), pp. 363-370.
Gould et al., "Magnetic resonant tunneling diodes as voltage-controlled spin selectors," 241 Phys. Stat. Sol. (B) 3, pp. 700-703 (2004).
Gustafsson et al., "Investigations of high quality $Ge_xSi_{1-x}$ grown by heteroepitaxial lateral overgrowth using cathodoluminescence," Inst. Phys. Conf. Ser. No. 134: Section 11, pp. 675-678 (1993).
Hayafuji et al., Jap. J. Appl. Phys. 29, pp. 2371 (1990).
Hersee, et al., "The Controlled Growth of GaN Nanowires," Nano Letters, vol. 6, No. 8 (2006), pp. 1808-1811.

Hiramatsu, K. et al., "Fabrication and characterization of low defect density GaN using facet-controlled epitaxial lateral overgrowth (FACELO)," Journal of Crystal Growth, v 221, Dec. 2000, pp. 316-326.
Hollander et al., "Strain and Misfit Dislocation Density in Finite Lateral Size $Si_{1-x}Ge_x$ Films Grown by Selective Epitaxy," Thin Solid Films, vol. 292, (1997) pp. 213-217.
Hu et al., "Growth of Well-Aligned Carbon Nanotube arrays on Silicon Substrates using Porous Alumina Film as a Nanotemplate," 79 App. Physics Letters 19 (2001).
Huang et al., "Electron and Hole Mobility Enhancement in Strained SOI by Wafer Bonding," 49 IEEE Trans. on Electron Devices 9, pp. 1566-1570 (2002).
International Technology Roadmap for Semiconductors—Front End Processes, pp. 1-62 (2005).
International Preliminary Report on Patentability for International Application No. PCT/US2007/019568, mailed Mar. 19, 2009 (7 pages).
International Preliminary Report on Patentability for International Application No. PCT/US2006/029247, mailed Feb. 7, 2008 (12 pages).
International Preliminary Report on Patentability for International Application No. PCT/US2006/033859, mailed Mar. 20, 2008 (14 pages).
International Preliminary Report on Patentability for International Application No. PCT/US07/021023, mailed Apr. 9, 2009 (8 pages).
International Preliminary Report on Patentability for International Application No. PCT/US2007/020181, mailed Apr. 2, 2009 (9 pages).
International Preliminary Report on Patentability for International Application No. PCT/US2006/019152, mailed Nov. 29, 2007 (7 pages).
International Preliminary Report on Patentability for International Application No. PCT/US07/022392, mailed Apr. 30, 2009 (14 pages).
International Preliminary Report on Patentability for International Application No. PCT/US07/020777, mailed Apr. 9, 2009 (12 pages).
International Search Report and Written Opinion for International Application No. PCT/US2006/033859, dated Sep. 12, 2007 (22 pages).
International Search Report and Written Opinion for International Application PCT/US2007/007373, dated Oct. 5, 2007 (13 pages).
International Search Report and Written Opinion for International Application No. PCT/US2007/020181, dated Jan. 25, 2008 (15 pages).
International Search Report and Written Opinion for International Application No. PCT/US07/020777, mailed Feb. 8, 2008 (18 pages).
International Search Report and Written Opinion for Patent Application No. PCT/US2006/019152, dated Oct. 19, 2006 (11 pages).
International Search Report and Written Opinion for International Application No. PCT/US2007/019568, mailed Feb. 6, 2008 (13 pages).
International Search Report and Written Opinion for International Application No. PCT/US07/022392, mailed Apr. 11, 2008 (20 pages).
Ipri, A.C. et al., "MONO/POLY technology for fabricating low-capacitance CMOS integrated circuits," *IEEE Transactions on Electron Devices*, vol. 35, No. 8, pp. 1382-1383, Aug. 1988.
Ishitani et al., "Facet Formation in Selective Silicon Epitaxial Growth," 24 Jap. J. Appl. Phys. 10, pp. 1267-1269 (1985).
Ismail et al., "High-quality GaAs on sawtooth-patterned Si substrates," 59 Applied Physics Letters 19, pp. 2418-2420 (1991).
Jain et al., "Stresses in strained GeSi stripes and quantum structures: calculation using the finite element method and determination using micro-Raman and other measurements," Thin Solid Films 292 (1997) pp. 218-226.
Jing Wang et al., "Fabrication of patterned sapphire substrate by wet chemical etching for maskless lateral overgrowth of GaN," Journal of the Electrochemical Society, v. 153, n. 3, Mar. 2006, p. C182-5.
Ju, W. et al., "Epitaxial lateral overgrowth of gallium nitride on silicon substrate," Journal of Crystal Growth, v. 263, Mar. 1, 2004, p. 30-4.

Kamiyama, S. et al., "UV laser diode with 350.9-nm-lasing wavelength grown by hetero-epitaxial-lateral overgrowth technology," *IEEE Journal of Selected Topics in Quantum Electronics*, vol. 11, No. 5, pp. 1069-1073, Sep.-Oct. 2005.
Kamiyama, S. et al., "UV light-emitting diode fabricated on hetero-ELO-grown $Al_{0.22}Ga_{0.78}N$ with low dislocation density," Physica Status Solidi A, v 192, n 2, Aug. 2002, pp. 296-300.
Kazi et al., "Realization of GaAs/AlGaAs Lasers on Si Substrates Using Epitaxial Lateral Overgrowth by Metalorganic Chemical Vapor Deposition," Jpn. J. Appl. Physics, vol. 40 (2001), pp. 4903-4906.
Kidoguchi, I. et al., "Air-bridged lateral epitaxial overgrowth of GaN thin films," Applied Physics Letters, v 76, n 25, Jun. 19, 2000, p. 3768-70.
Kimura et al., "Vibronic Fine Structure Found in the Blue Luminescence from Silicon Nanocolloids," Jpn. J. Appl. Physics, vol. 38 (1999), pp. 609-612.
Klapper, "Generation and Propagation of Dislocations During Crystal Growth," Mat. Chem. and Phys. 66, pp. 101-109 (2000).
Knall et al., Threading Dislocations in GaAs Grown with Free Sidewalls on Si mesas, J Vac. Sci. Technol. B, vol. 12, No. 6, (Nov./Dec. 1994) pp. 3069-3074.
Krost et al., "GaN-based Optoelectronics on Silicon Substrates," Materials Science & Engineering, B93 (2002) pp. 77-84.
Kushida, K. et al., "Epitaxial growth of $PbTiO_3$ films on $SrTiO_3$ by RF magnetron sputtering," *IEEE Transactions on Ultrasonics, Ferroelectrics and Frequency Control*, vol. 38, No. 6, pp. 656-662, Nov. 1991.
Kwok K Ng, Complete Guide to Semiconductor Devices, 2nd ed., Chapter 18 (2002).
Langdo, "Selective SiGe Nanostructures," Ph.D. Thesis, Massachusetts Institute of Technology (2001).
Langdo et al., "High Quality Ge on Si by Epitaxial Necking," Applied Physics Letters, vol. 76, No. 25 (Jun. 19, 2000), pp. 3700-3702.
Lee et al., "Strained-relieved, Dislocation-free $In_xGa_{1-x}As$/GaAs(001) Heterostructure by Nanoscale-patterned Growth," Applied Physics Letters, vol. 85, No. 18 (Nov. 1, 2004), pp. 4181-4183.
Lee, S.C. et al., "Growth of GaN on a nanoscale periodic faceted Si substrate by metal organic vapor phase epitaxy," *2003 International Symposium on Compound Semiconductors: Post-Conference Proceedings*, pp. 15-21.
Li et al, "Heteroepitaxy of High-quality Ge on Si by Nanoscale Ge seeds Grown through a Thin Layer of $SiO_2$," Applied Physics Letters, vol. 85, No. 11 (Sep. 13, 2004), pp. 1928-1930.
Li et al., "Morphological Evolution and Strain Relaxation of Ge Islands Grown on Chemically Oxidized Si(100) by Molecular-beam Epitaxy," Journal of Applied Physics, vol. 98, (2005), pp. 073504-1-073504-8 .
Li et al., Defect Reduction of GaAs Epitaxy on Si (001) Using Selective Aspect Ratio Trapping, 91 Applied Physics Letters 021114-1-021114-3 (2007).
Li et al., "Selective Growth of Ge on Si(100) through vias of $SiO_2$ Nanotemplate Using Solid Source Molecular Beam Epitaxy," Applied Physics Letters, vol. 83, No. 24 (Dec. 15, 2003), pp. 5032-5034.
Liang et al., "Critical Thickness Enhancement of Epitaxial SiGe films Grown on Small Structures," Journal of Applied Physics, vol. 97, (2005) pp. 043519-1-043519-7.
Lim et al., "Facet Evolution in Selective Epitaxial Growth of Si by cold-wall ultrahigh vacuum chemical vapor deposition," J. Vac. Sci. Tech. B 22(2), p. 682 (2004).
Liu et al., "High Quality Single-crystal Ge on Insulator by Liquid-phase Epitaxy on Si Substrates," Applied Physics Letters, vol. 84, No. 14, (Apr. 4, 2004) pp. 2563-2565.
Liu et al., "Rapid Melt Growth of Germanium Crystals with Self-Aligned Microcrucibles on Si Substrates," Journal of the Electrochemical Society, vol. 152, No. 8, (2005) G688-G693.
Loo et al., "Successful Selective Epitaxial $Si_{1-x}Ge_x$ Deposition Process for HBT-BiCMOS and high Mobility Heterojunction pMOS Applications," 150 J. Electrochem. Soc'y 10, pp. G638-G647 (2003).

Lourdudoss, S. et al., "Semi-insulating epitaxial layers for optoelectronic devices," *2000 IEEE International Semiconducting and Insulating Materials Conference*, pp. 171-178, 2000.

Luan et al., "High-quality Ge Epilayers on Si with Low Threading-dislocation Densities," Applied Phsics Letters, vol. 75, No. 19, (Nov. 8, 1999) pp. 2909-2911.

Luan, "Ge Photodectors for Si Microphotonics," Ph.D. Thesis, Massachusetts Institute of Technology, Feb. 2001.

Lubnow et al., "Effect of III/V-Compound Epitaxy on Si Metal-Oxide-Semiconductor Circuits," Jpn. J. Applied Phys., vol. 33 (1994) pp. 3628-3634.

Luryi et al., "New Approach to the High Quality Epitaxial Growth of Latticed-mismatch Materials," Appl. Phys. Lett., vol. 49, No. 3, (Jul. 21, 1986) 140-142.

Martinez et al., "Characterization of GaAs Conformal Layers Grown by Hydride Vapour Phase Epitaxy on Si Substrates by Microphotoluminescence Cathodoluminescence and microRaman," Journal of Crystal Growth, vol. 210 (2000) pp. 198-202.

Matsunaga et al., "A New Way to Achieve Dislocation-free Heteroepitaxial Growth by Molecular Beam Epitaxy: Vertical Microchannel Epitaxy," Journal of Crystal Growth, 237-239 (2002) pp. 1460-1465.

Matthews et al., "Defects in Epitaxial Multilayers—Misfit Dislocations," J. Crystal Growth 27, pp. 118-125(1974).

Monroy et al., "High UV/visible contrast photodiodes based on epitaxial lateral overgrown GaN layers," *Electronics Letters*, vol. 35, No. 17, pp. 1488-1489, Aug. 19, 1999.

Nakano, K. et al., "Epitaxial lateral overgrowth of AIN layers on patterned sapphire substrates," Source: Physica Status Solidi A, v 203, n 7, May 2006, pp. 1632-1635.

Nam et al., "Lateral Epitaxy of Low Defect Density GaN Layers via Organometallic Vapor Phase Epitaxy," Appl. Phys. Letters, vol. 71, No. 18, (Nov. 3, 1997) pp. 2638-2640.

Naoi et al, "Epitaxial Lateral Overgrowth of GaN on Selected-area Si(111) Substrate with Nitrided Si Mask," Journal of Crystal Growth, vol. 248, (2003) pp. 573-577.

Naritsuka et al., "InP Layer Grown on (001) Silicon Substrate by Epitaxial Lateral Overgrowth," Jpn. J. Appl. Physics, vol. 34 (1995), pp. L1432-L1435.

Naritsuka et al., "Vertical Cavity Surface Emitting Laser Fabricated on GaAs Laterally Grown on Si Substrate," Electrochemical Soc'y Proc. vol. 97-21, pp. 86-90.

Neudeck et al., "Novel silicon epitaxy for advanced MOSFET devices," *2000 IEDM Technical Digest*, pp. 169-172.

Neumann et a., "Growth of III-V resonant tunneling diode on Si Substrate with LP-MOVPE," J. of Crystal Growth 248, pp. 380-383 (2003).

Norman, A.G. et al., "Characterization of MOCVD lateral epitaxial overgrown III-V semiconductor layers on GaAs substrates," *2003 International Symposium onCompound Semiconductors*, pp. 45-46.

International Search Report and Written Opinion for Patent Application No. PCT/US2006/029247, dated May 7, 2007 18 pages).

Parillaud et al, "High Quality InP on Si by Conformal Growth," Appl. Phys. Lett., vol. 68, No. 19 (May 6, 1996) pp. 2654-2656.

Park et al., "Defect Reduction and Its Mechanism of Selective Ge Epitaxy in Trenches on Si(001) Substrates Using Aspect Ratio Trapping," Mat. Res. Soc'y Symp. Proc., vol. 994 (2007).

Park et al., "Growth of Ge Thick Layers on Si(001) Substrates Using Reduced Pressure Chemical Vapor Deposition," 45 Japanese J. Applied Physics 11, pp. 8581-8585 (2006).

Partial International Search Report for International Application No. PCT/US2008/068377, mailed Apr. 7, 2009.

Park et al., "Defect Reduction of Selective Ge Epitaxy in Trenches on Si(001) Substrates using Aspect Ratio Trapping," 90 Appl. Physics Letters (2007).

Pidin et al., "MOSFET Current Drive Optimization Using Silicon Nitride Capping Layer for 65-nm Technology Node," 2004 Symp. on VLSI Technology, Dig. Tech. Papers, pp. 54-55.

Piffault, N. et al., "Assessment of the strain of InP films on Si obtained by HVPE conformal growth," *Sixth International Conference on Indium Phosphide and Related Materials, Conference Proceedings.* ,pp. 155-158, Mar. 27-31, 1994.

Pribat et al., "High Quality GaAs on Si by Conformal Growth," Appl. Phys. Lett., vol. 60, No. 17 (Apr. 27, 1992) pp. 2144-2146.

Prost, W., ed. QUDOS Technical Report 2002-2004.

Reed et al., "Realization of a three-terminal resonant tunneling device: the bipolar quantum resonant tunneling transistor," 54 Appl. Phys. Letters 11, pp. 1034 (1989).

Ren, D. et al., "Low-dislocation-density, nonplanar GaN templates for buried heterostructure lasers grown by lateral epitaxial overgrowth," Applied Physics Letters, v 86, Mar. 14, 2005, 111901-1-111901-3.

Rim et al., "Enhanced Hole Mobilities in Surface-channel Strained-Si $p$-MOSFETs," 1995 IEDM, pp. 517-520.

Rim et al., "Fabrication and mobility characteristics of ultra-thin strained Si Directly on Insulator (SSDOI) MOSFETs," 2003 IEDM Tech. Dig., pp. 49-52.

Ringel et al., "Single-junction InGaP/GaAs Solar Cells Grown on Si Substrates with SiGe Buffer Layers," Prog. Photovolt.: Res. & Appl. 2002; 10:417-426.

Rosenblad et al., "A Plasma Process for Ultrafast Deposition of SiGe Graded Buffer Layers," 76 Applied Physics Letters 4, pp. 427-429 (2000).

Sakai, "Defect Structure in Selectively Grown GaN films with low threading dislocation density," Appl. Physics Letters 71(16), pp. 2259-2261 (1997).

Sakai, "Transmission electron microscopy of defects in GaN films formed by epitaxial lateral overgrowth," 73 App. Physics Letters 4, pp. 481-483 (1998).

Sakawa et al., "Effect of Si Doping on Epitaxial Lateral Overgrowth of GaAs on GaAs-Coated Si Substrate," Jpn. J. Appl. Physics, vol. 31 (1992), pp. L359-L361.

Sangwoo Pae et al., "Multiple layers of silicon-on-insulator islands fabrication by selective epitaxial growth," *IEEE Electron Device Letters*, vol. 20, No. 5, pp. 194-196, May 1999.

Schaub, J.D. et al., "Resonant-cavity-enhanced high-speed Si photodiode grown by epitaxial lateral overgrowth," *IEEE Photonics Technology Letters*, vol. 11, No. 12, pp. 1647-1649, Dec. 1999.

Seabaugh et al., "Promise of Tunnel Diode Integrated Circuits," Tunnel Diode and CMOS/HBT Integration Workshop, Dec. 9, 1999, Naval Research Laboratory.

Shahidi, G. et al., "Fabrication of CMOS on ultrathin SOI obtained by epitaxial lateral overgrowth and chemical-mechanical polishing," *1990 IEDM Technical Digest.*, pp. 587-590.

Shichijo et al., "Co-Integration of GaAs MESFET & Si CMOS Circuits," 9 Elec. Device Letters 9 (1988).

Siekkinen, J.W. et al., "Selective epitaxial growth silicon bipolar transistors for material characterization," *IEEE Transactions on Electron Devices*, vol. 35, No. 10, pp. 1640-1644, Oct. 1988.

Su et al., "Catalytic Growth of Group III-nitride Nanowires and Nanostructures by Metalorganic Chemical Vapor Deposition," Applied Physics Letters, vol. 86 (2005) pp. 013105-1-013105-3.

Sun, Y. et al., "Temporally resolved growth of InP in the openings off-oriented from [110] direction," *2000 International Conference on Indium Phosphide and Related Materials, Conference Proceedings*, pp. 227-230.

Sun, Y.T. et al., "InGaAsP multi-quantum wells at 1.5 μm wavelength grown on indium phosphide templates on silicon," *2003 International Conference on Indium Phosphide and Related Materials*,pp. 277-280.

Sun, Y.T.; Lourdudoss, S., "Sulfur doped indium phosphide on silicon substrate grown by epitaxial lateral overgrowth," *2004 International Conference on Indium Phosphide and Related Materials*, pp. 334-337.

Sun, Y.T.; Napierala, J.; Lourdudoss, S., "Selective area growth of InP on InP precoated silicon substrate by hydride vapor phase epitaxy," *2002 International Conference on Indium Phosphide and Related Materials Conference*, pp. 339-342.

Sun et al., "Thermal strain in Indium Phosphide on silicon obtained by Epitaxial Lateral Overgrowth," 94 J. of Applied Physics 4, pp. 2746-2748 (2003).

Suryanarayanan, G. et al., "Microstructure of lateral epitaxial overgrown InAs on (100) GaAs substrates," Applied Physics Letters, v 83, n 10, Sep. 8, 2003, p. 1977-9.

Su et al., "New planar self-aligned double-gate fully-depleted P-MOSFETs using epitaxial lateral overgrowth (ELO) and selectively grown source/drain (S/D)," *2000 IEEE International SOI Conference*, pp. 110-111.

Takasuka et al., "InGaAs/AlGaAs Quantum Wire DFB Buried HeteroStructure Laser Diode by One-Time Selective MOCVD on Ridge Substrate," 43 Jap. J. App. Phys. 4B (2005) pp. 2546-2548.

Takasuka et al., "AlGaAs/InGaAs DFB Laser by One-Time Selective MOCVD Growth on a Grating Substrate," 43 Jap. J. App. Phys. 4B (2004) pp. 2019-2022.

Tamura et al., "Heteroepitaxy on high-quality GaAs on Si for Optical Interconnections on Si Chip," Proceedings of the SPIE, vol. 2400, pp. 128-139 (1995).

Tamura et al., "Threading Dislocations in GaAs on Pre-patterned Si and in Post-patterned GaAs on Si," Journal of Crystal Growth, vol. 147, (1995) pp. 264-273.

Tanaka et al., "Structural Characterization of GaN Laterally Overgrown on a (111) Si Substrate," Applied Physics Letters, vol. 79, No. 7 (Aug. 13, 2001) pp. 955-957.

Thean et al., "Uniaxial-Biaxial Hybridization for Super-Critical Strained-Si Directly on Insulator (SC-SSOI) PMOS with Different Channel Orientations," IEEE, pp. 1-4 (2005).

Thompson et al., "A Logic Nanotechnology Featuring Strained-Silicon," 25 IEEE Electron Device Letters 4, pp. 191-193 (2004).

Tomiya, S. et al., "Dislocation related issues in the degradation of GaN-based laser diodes," *IEEE Journal of Selected Topics in Quantum Electronics*, vol. 10, No. 6, pp. 1277-1286, Nov.-Dec. 2004.

Tran et al., "Growth and Characterization of InP on Silicon by MOCVD," Journal of Crystal Growth, vol. 121, (1992) pp. 365-372.

Tsang, W. et al., "The heteroepitaxial ridge-overgrown distributed feedback laser," *IEEE Journal of Quantum Electronics*, vol. QE-21, No. 6, pp. 519-526, Jun. 1985.

Tsaur, B.-Y. et al., "Low-dislocation-density GaAs epilayers grown on Ge-coated Si substrates by means of lateral epitaxial overgrowth," Applied Physics Letters, v 41, n 4, Aug. 15, 1982, 347-9.

Tseng et al., "Effects of Isolation Materials on Facet Formation for Silicon Selective Epitaxial Growth," 71 Appl. Phys. Letters 16, pp. 2328 (1997).

Tsuji et al., "Selective Epitaxial Growth of GaAs on Si with Strained Sort-period Superlattices by Molecular Beam Epitaxy under Atomic Hydrogen Irradiation," J. Vac. Sci. Technol. B., vol. 22, No. 3, (May/Jun. 2004) pp. 1428-1431.

Usuda et al., "Strain relaxation of strained-Si layers on SiGe-on-insulator (SGOI) structures after mesa isolation," Applied Surface Sci. 224, pp. 113-116 (2004).

Usui et al., "Thick GaN Epitaxial Growth with Low Dislocation Density by Hydride Vapor Phase Epitazy," 36 Jap. J. of Applied Physics, pp. L899-L902 (1997).

Vanamu et al., "Epitaxial Growth of High-quality Ge Films on Nanostructured Silicon Substrates," Applied Physics Letters, vol. 88, (2006) pp. 204104-1-204104-3.

Vanamu et al., "Growth of High Quality Ge/$Si_{1-x}Ge_x$ on Nano-scale Patterned Si Structures," J. Vac. Sci. Techn. B, vol. 23, No. 4, (Jul./Aug. 2005) pp. 1622-1629.

Vanamu et al., "Heteroepitaxial Growth on Microscale Patterned Silicon Structures," Journal of Crystal Growth, vol. 280, (2005) pp. 66-74.

Vanamu et al., "Improving Ge/$Si_xGe_{1-x}$ Film Quality through Growth onto Patterned Silicon Substrates," Advances in Electronics Manufacturing Technology, V-EMT 1:25 (Nov. 8, 2004), pp. 1-4.

Vescan et al., "Lateral confinement by low pressure chemical vapor deposition-based selective epitaxial growth of $Si_{1-x}Ge_x$/Si nanostructures," 81 J. of Applied Physics 10, pp. 6709-6715 (1997).

Ventury et al., "First Demonstration of AlGaN/GaN Heterostructure Field Effect Transistor on GaN grown by lateral epitaxial overgrowth (LEO)," Inst. Phys. Conf. Ser. No. 162: Ch. 5, pp. 177-183.

Wernersson et al., "InAs Epitaxial Lateral growth of W Masks," Journal of Crystal Growth, vol. 280 (2005) pp. 81-86.

Wuu, D.S. et al., "Defect reduction and efficiency improvement of near-ultraviolet emitters via laterally overgrown GaN on a GaN/patterned sapphire template," Applied Physics Letters, v 89, n 16, Oct. 16, 2006, pp. 161105-1-161105-3.

Xie et al., "From Porous Si to Patterned Si Substrate: Can Misfit Strain Energy in a Continuous Heteroepitaxial Film Be Reduced?" J Va. Sci. Technol. B, vol. 8, No. 2, (Mar./Apr. 1990) pp. 227-231.

Xu et al., "Spin-filter devices based on resonant tunneling antisymmetrical magnetic semiconductor hybrid structures," 84 App. Phys. Letters 11, pp. 1955-1957 (2004).

Yamaguchi et al., "GaAs Solar Cells Grown on Si Substrates for Space Use," Prog. Photovolt.: Res. Appl. 2001; 9:191-201.

Yamaguchi et al., "Defect Reduction Effects in GaAs on Si Substrates by Thermal Annealing," Appl. Phys. Letters 53(23), pp. 2293 (1988).

Yamaguchi et al., "Super-high-efficiency Multi junction Solar Cells," Prog. Photovolt.: Res. Appl. 2005; 13:125-132.

Yamaguchi et al., "Analysis for Dislocation Density Reduction in Selective Area Grown GaAs Films on Si Substrates," Appl. Phys. Lett. vol. 56, No. 1, (Jan. 1, 1990) pp. 27-29.

Yamamoto et al., "Optimization of InP/Si Heteroepitaxial Growth Conditions Using Organometallic Vapor Phase Epitaxy," Journal of Crystal Growth, vol. 96, (1989) pp. 369-377.

Yang et al., "High Performance CMOS Fabricated on Hybrid Substrate with Different Crystal Orientations," 2003 IEDM Tech. Dig., pp. 453-456.

Yang et al., "Selective Area Deposited Blue GaN—InGaN Multiple-quantum Well Light Emitting Diodes over Silicon Substrates," Applied Physics Letter, vol. 76, No. 3, (Jan. 17, 2000) pp. 273-275.

Yin et al., "Ultrathin Strained-SOI by Stress Balance on Compliant Substrates and FET Performance," 52 IEEE Trans. on Electron Devices 10, pp. 2207-2214 (2005).

Dong et al., "Selective area growth of InP through narrow openings by MOCVD and its application to InP HBT," *2003 International Conference on Indium Phosphide and Related Materials*, pp. 389-392.

Yoon et al., "Selective Growth of Ge Islands on Noanometer-scale Patterned SiO2/Si Substrate by Molecular Beam Epitaxy," Applied Physics Letters, vol. 89 (2006) pp. 063107-1-063107-3.

Zamir et al., "Thermal Microcrack Distribution Control in GaN Layers on Si Substrates by Lateral Confined Epitaxy," Applied Physics Letters, vol. 78, No. 3, (Jan. 15, 2001) pp. 288-290.

Zang, K.Y. et al., "Nanoscale lateral epitaxial overgrowth of GaN on Si (111)," Applied Physics Letters, v 87, Nov. 7, 2005, pp. 193106-1-193106-3.

Zang, K.Y. et al., "Nanoheteroepitaxial lateral overgrowth of GaN on nanoporous Si(111)," Applied Physics Letters, v 88, n 14, Apr 3, 2006, p. 141925.

Zela et al., "Single-crystalline Ge Grown Epitaxially on Oxidized and Reduced Ge/Si (100) Islands," Journal of Crystal Growth, vol. 263 (2004) pp. 90-93.

Zhang et al., "Removal of Threading Dislocations from Patterned Heteroepitaxial Semiconductors by Glide to Sidewalls," Journal of Electronic Materials, vol. 27, No. 11, (1998) pp. 1248-1253.

Zhang et al., "Strain Status of Self-assembled InAs Quantum Dots," Applied Physics Letters, vol. 77, No. 9, (Aug. 28, 2000) pp. 1295-1297.

Zheleva, T.S.; Ok-Hyun Nam; Ashmawi, W.M.; Griffin, J.D.; Davis, R.F., "Lateral epitaxy and dislocation density reduction in selectively grown GaN structures," Journal of Crystal Growth, v 222, n 4, Feb. 2001, p. 706-18.

Zubia et al., "Initial Nanoheteroepitaxial Growth of GaAs on Si(100) by OMVPE," Journal of Electronic Materials, vol. 30, No. 7, (2001) pp. 812-816.

Campo et al., "Comparison of Etching Processes of Silicon and Germanium in $SF_6$—$O_2$ Radio-Frequency Plasma," 13 J. Vac. Sci. Tech. B 2, pp. 235-241 (1995).

Oehrlein et al., "Studies of the Reactive Ion Etching of SiGe Alloys," 9 J. Vac. Sci. Tech. A 3, pp. 768-774 (1991).

Bogumilowicz et al., "Chemical Vapour Etching of Si, SiGe and Ge with HCL; Applications to the Formation of Thin Relaxed SiGe Buffers and to the Revelation of Threading Dislocations," 20 Semicond. Sci. Tech., pp. 127-134 (2005).

Williams et al., "Etch Rates for Micromachining Processing—Part II," 12 J. Microelectromechanical Sys. 6, pp. 761-778 (2003).

Williams et al., "Etch Rates for Micromachining Processes," 5 J. Microelectromechanical Sys. 4, pp. 256-269 (1996).

Partial International Search Report for International Application No. PCT/US2008/004564, mailed Jul. 30, 2009 (9 pages).
International Search Report and Written Opinion for International Application No. PCT/US2008/068377, mailed Jul. 6, 2009 (19 pages).
Wu et al., "Inversion-type enhancement-mode InP MOSFETs with ALD $Al_2O_3$, HfAlO nanolaminates as high-k gate dielectrics," Proceedings of the 65th Device Research Conf. (2007).
Wu et al., "Enhancement-mode InP n-channel metal-oxide-semiconductor field-effect-transistors with atomic-layer-deposited $Al_2O_3$ dielectrics," Applied Physics Letters 91, 022108-022110 (2007).
"Communication pursuant to Article 94(3) EPC," Application No. 06 770 525.1-2203, Applicant: Taiwan Semiconductor Company, Ltd., Feb. 17, 2011, 4 pages.
Ames, "Intel Says More Efficient Chips are Coming," PC World, available at: http://www.pcworld.com/printable/article/id,126044/printable.html (Jun. 12, 2006); 4 pages.
Asaoka, et al., "Observation of 1 f $_x$/noise of GaInP/GaAs triple barrier resonant tunneling diodes," AIP Conf. Proc., vol. 780, Issue 1, 2005, pp. 492-495.
Belyaev, et al., "Resonance and current instabilities in AlN/GaN resonant tunneling diodes," 21 Physica E 2-4, 2004, pp. 752-755.
Berg, J., "Electrical Characterization of Silicon Nanogaps," Doktorsavhandlingar vid Chalmers Tekniska Hagskola, 2005, No. 2355, 2 pages.
Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.
Calado, et al., "Modeling of a resonant tunneling diode optical modulator," University of Algarve, Department of Electronics and Electrical Engineering, 2005, pp. 96-99.
Chang et al. "3-D simulation of strained Si/SiGe heterojunction FinFETs" Semiconductor Device Research Symposium, Dec. 10-12, 2003, pp. 176-177.
Chengrong, et al., "DBRTD with a high PVCR and a peak current density at room temperature," Chinese Journal of Semiconductors vol. 26, No. 10, Oct. 2005, pp. 1871-1874.
Choi, et al., "Low-voltage low-power K-band balanced RTD-based MMIC VCO," 2006 IEEE, Department of EECS, Korea Advanced Institute of Science and Technology, 2006, pp. 743-746.
Dong et al., "Selective area growth of InP through narrow openings by MOCVD and its application to inP HBT," Indium Phosphide and Related Materials, International Conference, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office on Dec. 15, 2010 in European Patent Application No. 10002884.4 (10 pages).
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gruber, et al., "Semimagnetic Resonant Tunneling Diodes for Electron Spin Manipulation," Nanostructures: Physics &. Technology, 8th International Symposium, 2000, pp. 483-486.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.
International Search Report and Written Opinion for International Application No. PCT/US2007/021023 mailed Jun. 6, 2008, 10 pages.
International Search Report for International Application No. PCT/US2006/019152, mailed May 17, 2005. 11 pages.
Ishibashi, et al., "3rd Topical Workshop on Heterostructure Microelectronics for Information Systems Applications," Aug.-Sep. 1998, 115 pages.
Jeong, et al., "Performance improvement of InP-based differential HBT VCO using the resonant tunneling diode," 2006 International Conf. on Indium Phosphide and Related Mat. Conf. Proc., pp. 42-45.
Kamins et al., "Kinetics of Selective Epitaxial Depostion of Si1–xGex," Hewlett-Packard Company, Palo Alto, CA, Appl. Phys. Lett. 61 (6), Aug. 10, 1992 (pp. 669-671).
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kim et al., "Silicon-Based Field-Induced Band-to-Band Tunneling Effect Transistor," IEEE Electron Device Letters, No. 25, No. 6, 2004, pp. 439-441.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kwok K. Ng, "Resonant-Tunneling Diode," Complete Guide to Semiconductor Devices, Chapter 10. Nov. 3, 2010, pp. 75-83.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Sudirgo et al., "Si-Based Resonant Interband Tunnel Diode/CMOS Integrated Memory Circuits," Rochester Institute of Technology, IEEE, 2006, pp. 109-112.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.
Ma, et al., "A small signal equivalent circuit model for resonant tunneling diode," Chinese Physics Letters, vol. 23, No. 8, Aug. 2006, pp. 2292-2295.
Ma, et al., "Fabrication of An AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1–x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs," 44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.

Notification of Transmittal of the International Search Report and the Written Opinion of the International Searching Authority for PCT/US2010/029552, Applicant: Taiwan Semiconductor Manufacturing Company, Ltd., May 26, 2010, 14 pages.

Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.

Park et al., "Fabrication of Low-Defectivity, Compressively Strained Geon $Si_{0.2}G^e_{0.8}$ Structures Using Aspect Ratio Trapping," Journal of the Electrochemical Society, vol. 156, No. 4, 2009, pp. H249-H254.

PCT International Search Report of PCT/US2009/057493, from PCT/ISA/210, mailed Mar. 22, 2010, Applicant: Amberwave System Corporation et al., 2 pages.

Prost, et al., "High-speed InP-based resonant tunneling diode on silicon substrate," Proceedings of the 31st European Solid-State Device Research Conf., 2005, pp. 257-260.

Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.

Sass, et al., "Strain in GaP/GaAs and GaAs/GaP resonant tunneling heterostructures," Journal of Crystal Growth, vol. 248, Feb. 2003, pp. 375-379.

Shubert, E.F., "Resonant tunneling diode (RTD) structures," Rensselear Polytechnic Institute, 2003, pp. 1-14.

Suhara, et al, "Characterization of argon fast atom beam source and its application to the fabrication of resonant tunneling diodes," 2005 International Microprocesses and Nanotechnology Conf. Di. of Papers, 2005, pp. 132-133.

Sun et al., Electron resonant tunneling through InAs/GaAs quantum dots embedded in a Schottky diode with an AlAs insertion layer, 153 J. Electrochemical Society 153, 2006, pp. G703-G706.

Sun et al., "Room-temperature observation of electron resonant tunneling through InAs/AlAs quantum dots," 9 Electrochemical and Solid-State Letters 5, May 2006, pp. G167-G170.

Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International Conference on Terahertz Electronics, 2005, pp. 150-151.

Thelander, et al., "Heterostructures incorporated in one-dimensional semiconductor materials and devices," Physics of Semiconductors, vol. 171, 2002, 1 page. Abstract Only.

Ting, et al., "Modeling Spin-Dependent Transport in InAS/GaSb/AlSb Resonant Tunneling Structures," 1 J. Computational Electronics, 2002, pp. 147-151.

Tomiya, "Dependency of crystallographic tilt and defect distribution of mask material in epitaxial lateral overgrown GaN layers," Applied Physics Letters vol. 77, No. 5, pp. 636-638.

Tsai, et al., "InP/InGaAs resonant tunneling diode with six-route negative differential resistances," 13th European Gallium Arsenide and other Compound Semiconductors Application Symp., 2006, pp. 421-423.

Walker, et al., "Magnetotunneling spectroscopy of ring-shaped (InGa)As quantum dots: Evidence of excited states with 2pz character," 32 Physica E 1-2, May 2006, pp. 57-60.

Watanabe, et al., "Fluoride resonant tunneling diodes on Si substrates," IEEE International Semiconductor Device Research Symp. Dec. 2005, pp. 177-178.

Wu et al., Gross-Sectional Scanning/Tunneling Microscopy Investigations of Cleaned III-V Heterostructures, Technical report, Dec. 1996, 7 pages.

Yanlong, et al., "Monolithically fabricated OEICs using RTD and MSM," Chinese Journal Semiconductors vol. 27, No. 4, Apr. 2006, pp. 641-645.

Yili, et al., "Physics-based hydrodynamic simulation of direct current characteristics in DBRTD," 29 Chinese J. Electron. Devices 2, Jun. 2006, pp. 365-368.

Ying-Long, et al., "Resonant tunneling diodes and high electron mobility transistors integrated on GaAs substrates," Chinese Physics Letters 23, vol. 3, Mar. 2006, pp. 697-700.

Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.

\* cited by examiner

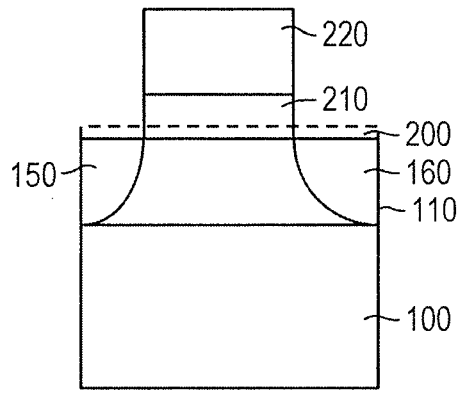
FIG. 2A
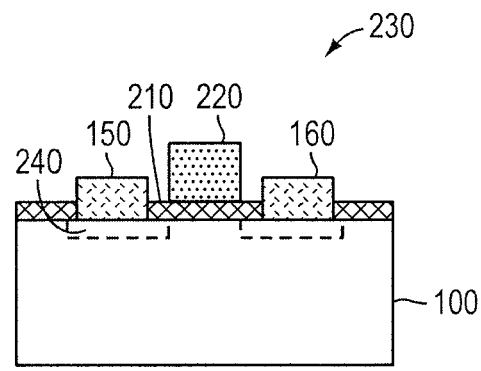
FIG. 2B
- SURFACE CLEAN AND PRETREATMENT $(NH_4)_2S$
- DEPOSITION OF 30 nm $Al_2O_3$ USING ALD
- ION IMPLANTATION (Si 35Kev, $1 \times 10^{14}/cm^2$)
- ACTIVATION USING RTA 720 °C FOR 10 sec
- FOR REGROWN OXIDE, ETCH AWAY OXIDE USING BHF AND REGROW 8 nm $Al_2O_3$ OR $HfO_2$ OR HfAlO AND PDA
- S/D REGION PATTERNING AND METAL DEPOSITION AuGe/Ni/Au AND RTA
- GATE REGION PATTERNING AND METAL DEPOSITION Ni/Au
FIG. 2C
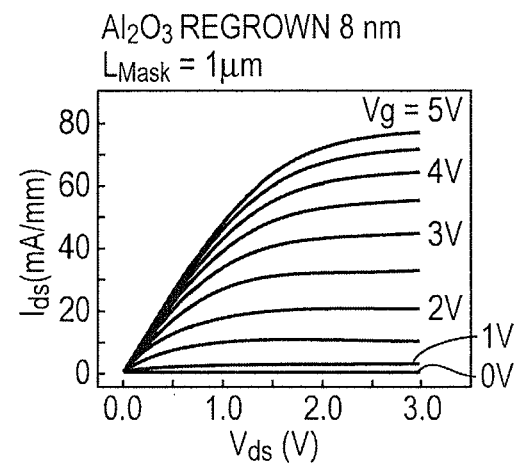
FIG. 2D

INP-BASED TRANSISTOR FABRICATION

RELATED APPLICATION

This application claims the benefit of and priority to U.S. Provisional Application Ser. No. 60/934,716, filed Jun. 15, 2007, the entire disclosure of which is incorporated by reference herein.

TECHNICAL FIELD OF THE INVENTION

The technology disclosed herein relates generally to semiconductor structures and methods of making semiconductor structures and more specifically to use of alternatives to Si for constructing transistors using InP-based materials.

BACKGROUND

The increasing operating speeds and miniaturization of semiconductor devices have given rise to a need to find alternatives to silicon for the source, drain, and channel regions of transistors and to $SiO_2$ for the gate dielectric of FET transistors. Research has been performed on compound semiconductors such as GaAs and other III-V materials for high-performance transistor applications. Although there have been successful demonstrations of depletion-mode GaAs metal-oxide-semiconductor field-effect transistors (MOSFETs), inversion-type enhancement-mode GaAs MOSFETs have suffered from problems such as relatively low drain currents. Notwithstanding research and development efforts by many institutions into aspects of III-V materials, there remains a need for commercially viable techniques for providing improved performance using materials such as InP.

SUMMARY

According to aspects of embodiments of the invention described below, atomic layer deposition (ALD) techniques with high-k gate dielectrics are used to provide inversion-type enhancement-mode InP-based MOSFETs that demonstrate substantial technological improvements. For example, drain currents for InP devices described below may have drain currents more than 1,000 times greater than drain currents for existing enhancement-mode GaAs MOSFETs. Other aspects include improved performance with respect to Fermi level pinning and higher electron saturation velocity ($2 \times 10^7$ cm/s). At equivalent gate lengths, aspects of the embodiments described below can provide high-field transconductance greatly improved (>50% higher) in comparison to devices having equivalent channel lengths and fabricated with more conventional semiconductors such as Si, Ge, or GaAs. The ALD high-k/InP-based material system mitigates problems associated with Fermi-level pinning reported in the literature.

Provision of high-performance InP-based MOSFETs may enable a new generation of high-frequency transistors because of the intrinsically higher and robust charge-transport properties of InP-based materials relative to other semiconducting materials. The presence of a gate dielectric in MOSFET structures reduces overall device leakage and enhances both control and responsivity of channel regions. The need for gate dielectric materials suitable for use with InP, and methods for formation thereof, has hitherto limited the commercialization of InP-based MOSFETS. Previous efforts focused on the deposition of dielectric materials on InP have resulted in various difficulties including interfacial chemical instabilities, electronic instabilities such as Fermi-energy pinning, and device fabrication difficulties involving high series-resistance source and drain terminals. Embodiments of the present invention provide techniques enable the fabrication of commercially viable InP-based MOSFETs, a long-sought but yet-to-be-achieved goal.

In an aspect, an embodiment of the invention includes a method of fabricating a transistor. An InP-based material layer structure including a channel layer is provided. A source region and a drain region are defined in the InP-based material layer structure. A channel region is provided between the source and drain regions, the channel region including at least a portion of the channel layer. A gate dielectric is deposited over the channel region by atomic layer deposition (ALD). A gate is provided above the channel region. At least a portion of the gate dielectric may be disposed between the gate and the channel region, and the transistor may operate as an inversion-type, enhancement-mode device.

One or more of the following features may be included. The source and drain regions are at least partially disposed in the channel layer. The source and drain regions are disposed above the channel layer. The gate dielectric comprises at least one of a group II material and/or a transition metal, e.g., includes at least one of aluminum, $Al_2O_3$, hafnium, and/or HfO. The channel layer may include a strained region. The channel layer may include at least one of InSb, InGaAs, InAs, and/or InP. The channel layer may include a plurality of substantially lattice-matched layers.

The transistor may be, e.g., a MOSFET or a HEMT. The InP-based material layer may be provided over a silicon substrate.

In another aspect, an embodiment of the invention includes a method of fabricating a transistor. An InP-based material layer including a channel layer is provided. A source region and a drain region are defined in the InP-based material layer. A channel region is provided between the source and drain regions, the channel region including at least a portion of the channel layer. A gate dielectric is formed over the channel region, the gate dielectric including at least one of a group II material or a transition metal. A gate is provided above the channel region. At least a portion of the gate dielectric may be disposed between the gate and the channel region, and the transistor may operate as an inversion-type, enhancement-mode device.

One or more of the following features may be included. The gate dielectric may include aluminum and/or hafnium. The gate dielectric is formed by ALD.

In still another aspect, an embodiment of the invention includes a method of fabricating a semiconductor structure. A semiconductor layer comprising indium and phosphorous is provided. A dielectric layer comprising hafnium is deposited by ALD above at least a portion of the semiconductor layer. A conductive layer is provided over at least a portion of the dielectric layer. The dielectric layer is disposed between the semiconductor layer and the conductive layer.

One or more of the following features may be included. The semiconductor layer includes a transistor channel region and the conductive layer including a transistor gate region. The dielectric layer may include at least one of oxygen, silicon, and/or nitrogen. The semiconductor layer is provided over a substrate that includes silicon.

In another aspect, an embodiment of the invention includes a semiconductor structure. The structure includes a silicon substrate. An InP-based material layer structure including a channel layer is disposed above the substrate. A transistor including a source region, a drain region, and an inversion-type channel region may be disposed at least partially within the channel layer, and a gate region is disposed above the channel region.

One or more of the following features may be included. A mask layer is disposed above the substrate and includes a plurality of openings; a second layer of material having a lattice-mismatch with silicon is disposed within the openings. The second layer may include indium and phosphorous.

A dielectric layer is disposed between the channel region and the gate region, the dielectric layer including at least one of aluminum and/or hafnium. The channel layer includes a strained region. The channel layer includes at least one of InSb, InGaAs, InAs, and/or InP. The channel layer includes a plurality of substantially lattice-matched layers.

In still another aspect, an embodiment of the invention includes a method of making a semiconductor structure. A substrate including a top layer having a compound comprising indium and a second element is provided. A dielectric layer is provided over the top layer, a region of the dielectric layer adjacent the top layer being substantially non-reactive with indium and the second element and configured to suppress out-diffusion of dopants from the top layer during a thermal anneal step. A dopant species is implanted into the top layer. The top layer is thermally annealed to activate the dopant at a relatively high temperature.

One or more of the following features may be included. The second element is phosphorous, antimony, aluminum, gallium, and/or arsenic. Implanting a dopant species into the top layer includes implanting the dopant species through the dielectric layer. The dielectric layer includes first and second layers, the first layer being adjacent the top layer and substantially non-reactive with indium and the second element, the first layer having a first composition and the second layer having a second composition different from the first composition. The second layer includes oxygen, aluminum, and/or hafnium. The substrate includes a bottom portion including silicon.

In another aspect, an embodiment of the invention includes a method of forming a transistor. The method includes providing a substrate including a top layer disposed thereover, the top layer including a compound comprising indium and a second element. A dielectric layer is deposited above the top substrate layer by atomic layer deposition. A mask layer may be disposed above the dielectric layer to define a gate region, a source region, and a drain region of a transistor. A dopant is implanted through the dielectric layer into the source region and the drain region proximate the gate region, the mask layer blocking implantation of the dopant into the gate region. A high temperature anneal is performed to activate the dopant in the source and drain regions.

One or more of the following features may be included. The substrate includes a bottom portion including silicon. Implanting a dopant through the dielectric layer to define the source and drain regions substantially amorphizes the source and drain regions. The high temperature anneal recrystallizes the source and drain regions. A portion of the mask layer is replaced with a gate structure without lithography so that the gate structure is aligned to the source and drain regions. A substantially lattice-matched layer is provided atop the substrate in which the source and drain regions are formed. The layer may include at least one of InSb, InGaAs, InAs, and/or InP; the layer may include a plurality of substantially lattice-matched layers.

In another aspect, an embodiment of the invention includes a method of forming a transistor. A substrate including indium and phosphorous is provided. A mask layer is disposed above the substrate to define a gate region of a transistor. A dopant is implanted to create source and drain regions, with the mask layer blocking implantation of the dopant into the gate region. A portion of the mask layer is replaced with a gate structure without lithography so that the gate structure is aligned to the source and drain regions.

One or more of the following features may be included. The substrate includes a bottom portion including silicon. Implanting a dopant substantially amorphizes the source and drain regions. A high temperature anneal is performed to activate the dopant and to recrystallize the source and drain regions.

A high temperature anneal is performed to activate the dopant in the source and drain regions. The gate structure includes a dielectric layer created after performing a high temperature anneal to activate the dopant.

In yet another aspect, an embodiment of the invention includes a method of forming a transistor. A substrate comprising indium and phosphorous is provided. A mask is provided above the substrate to define source, drain, and gate regions of a transistor. A dopant is implanted into the source and drain regions. At least a portion of the source and drain regions is amorphized. An anneal is performed to recrystallize the amorphized portions of the source and drain regions.

One or more of the following features may be included. The substrate includes a bottom portion comprising silicon. The substrate includes a top layer comprising indium and phosphorous, InP, InSb, InGaAs and/or InAs. A barrier layer in contact with a top portion of the substrate is provided. A region of the barrier layer in contact with the top portion of the substrate is substantially free of oxygen and/or includes nitrogen. The barrier layer includes at least one of AlN, TaN, and/or TiN.

The barrier layer includes a dielectric layer relatively inert to the top portion and the dielectric layer is formed by atomic layer deposition. A second dielectric layer is provided above the dielectric layer, with the second dielectric layer being not inert to the top portion of the substrate.

The barrier layer is oxidized to improve a dielectric property of the barrier layer. The steps of implanting and amorphizing include a single step of implanting a dopant that amorphizes at least a portion of the source and drain regions. The dopant includes SiX, with X including a group VIIA element. Ohmic contacts adjacent the source and drain regions are defined.

In still another aspect, an embodiment of the invention includes forming a transistor. A substrate including indium and phosphorous is provided. A mask layer may be formed above the substrate to define a source region, a drain region, and a gate region of a transistor. A dopant is implanted into the source and drain regions, the mask layer blocking implantation of the dopant into the gate region. The mask layer is removed to expose the gate region. At least a portion of a channel layer is epitaxially grown.

One or more of the following features may be included. The portion of the channel layer is epitaxially grown by ALD, MBE, or CVD. Epitaxially growing at least a portion of the channel layer includes growing one or more of InSb, InGaAs, InAs, and/or InP. The gate channel includes indium and phosphorous; indium and antimony; indium and arsenic; and/or gallium and arsenic.

The substrate includes a top surface prior to the step of forming the mask layer, the gate channel layer includes a top surface, and the top surface of the gate channel layer is disposed above the top surface of the substrate. The substrate includes a top surface prior to the step of forming the mask layer, the gate channel layer includes a bottom surface, and the bottom surface of the gate channel layer is disposed below the top surface of the substrate.

In yet another aspect, an embodiment of the invention includes a method of forming a transistor. The method includes providing a substrate including indium and phosphorous. A mask layer may be disposed above the substrate to define source, drain, gate, and gate channel regions of a transistor. A first dopant type is provided in the gate channel region. A portion of the substrate in the source and drain regions may be removed to form source and drain recesses. The source and drain recesses are filled with a semiconductor material having a second dopant type different from the first dopant type.

One or more of the following features may be included. The second dopant type is opposite from the first dopant type. Filling the source and drain recesses includes an epitaxial growth technique, e.g., at least one of MBE, ALD, and CVD. Filling the source and drain recesses includes filling the source and drain recesses with a material having a lattice constant different from a lattice constant of the substrate and the material induces stress in the channel region. The semiconductor material includes at least one of GaAs, InGaAs, In-rich InGaAs, or InP.

In another aspect, an embodiment of the invention includes a method of fabricating a transistor. A crystalline substrate having a first lattice constant substantially different from a lattice constant of InP is provided. A non-crystalline mask is provided above the substrate, the mask including an opening having sidewalls that extend above the substrate by a height. A crystalline buffer layer having a second lattice constant substantially similar to the lattice constant of InP may be provided within the opening. The buffer layer may have a height less than the mask opening sidewall height, the buffer layer height being sufficient to permit defects arising from the lattice mismatch to exit the buffer layer at the mask opening sidewalls. A channel layer is provided above the buffer layer, the channel layer being substantially lattice-matched with the buffer layer. A source region, a drain region, and a channel region of a transistor are defined in the channel layer. A gate is provided above the channel layer.

One or more of the following features may be included. The substrate is a silicon substrate. The mask includes $SiO_2$. The buffer layer includes a III-V material, e.g., InP. The channel layer includes at least one of InP, InSb, InGaAs, InAs, and/or InP. The channel layer is disposed within the mask opening. The channel layer is disposed substantially completely above the mask. The transistor is an inversion-type, enhancement-mode transistor.

In another aspect, an embodiment of the invention includes a method of processing a semiconductor structure. A substrate comprising indium and phosphorous is provided. Oxide from a top surface of the substrate is removed using at least one of HF, HCl, and $NH_4OH$. The top surface is passivated using at least one of an $(NH_4)_2S$ or an OH-group compound.

The removing and passivating steps may be performed in situ or performed ex situ.

BRIEF DESCRIPTION OF THE DRAWINGS

FIGS. 2(a)-(j) are schematic cross-sectional views of enhancement-mode InP MOSFETs fabricate in accordance with embodiments of the invention, and charts describing experimental procedures and data obtained for enhancement-mode InP MOSFETs;

DETAILED DESCRIPTION

Aspects of this invention address, among other things, the challenges of forming a high-quality interface between a gate dielectric and InP and other InP-based materials through the use of ALD. See also Y. Q. Wu, et al., "Inversion-type enhancement-mode InP MOSFETs with ALD $Al_2O_3$, $HfO_2$ and HfAlO nanolaminates as high-k gate dielectrics," *Proceedings of 65th Device Research Conference*, Notre Dame, USA (2007) and Y. Q. Wu, et al., "Enhancement-mode InP n-channel metal-oxide-semiconductor field-effect-transistors with atomic-layer-deposited $Al_2O_3$ dielectrics," *Applied Physics Letters* 91, 022108-022110 (2007), incorporated by reference herein in their entireties.

Figure 1A:
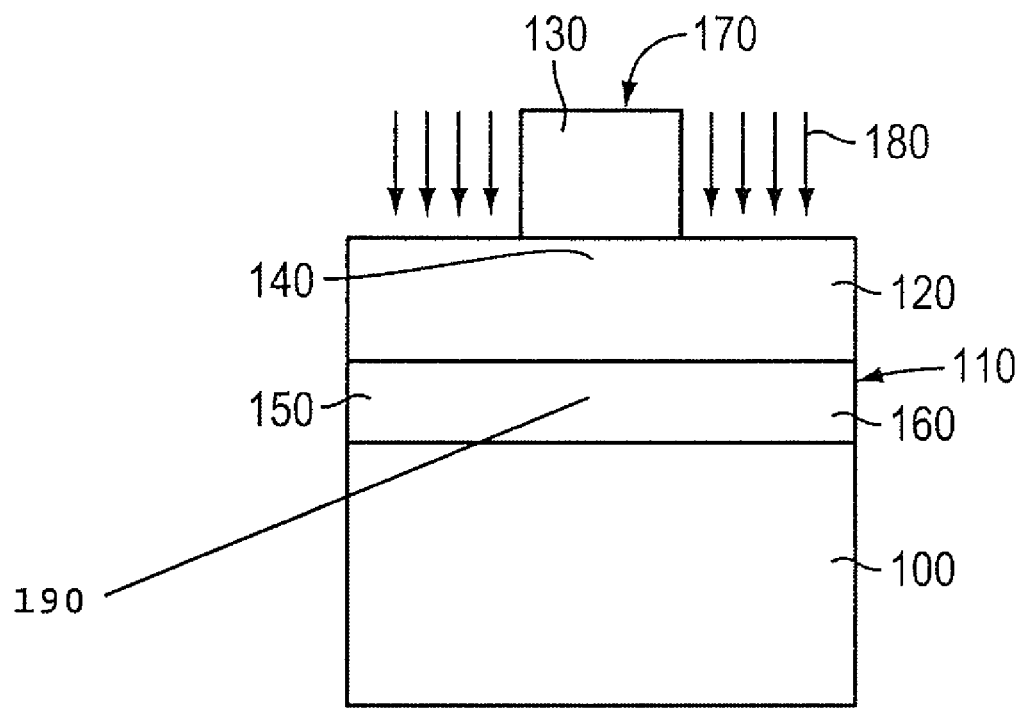
FIGS. 1(a)-(b) are schematic cross-sectional views illustrating an embodiment of the invention including the implantation and anneal of source and drain regions through a layer that is subsequently removed.

Referring to FIG. 1(a), a semiconductor substrate 100 has an InP-based top layer 110 disposed thereover. In various embodiments, a portion of this InP layer may be used to form a channel for a transistor. The substrate 100 may include a semiconductor material and may be, for example, a bulk silicon wafer, a bulk germanium wafer, a semiconductor-on-insulator (SOI) substrate, or a strained semiconductor-on-insulator (SSOI) substrate. The substrate 100 may include or consist essentially of a first semiconductor material, such as a group IV element, e.g., germanium or silicon. In an embodiment, the substrate 100 includes or consists essentially of (100) silicon. In some embodiments, the substrate 100 is an InP substrate, with a top region of the InP substrate defining the InP-based top layer 110.

The InP-based top layer 110 may be formed by molecular beam epitaxy (MBE), a chemical vapor deposition (CVD) process, e.g., metalorganic CVD (MOCVD), or other deposition techniques on the substrate 100. In an embodiment in which the InP-based top layer 110 is InP disposed over an InP substrate, the top layer may have a thickness ranging from, e.g., 1 nm to 100 µm. In an embodiment, the composition and lattice constant of the InP-based top layer 110 is different from the composition and lattice constant of the substrate 100. In a preferred embodiment, the thickness of the InP-based top layer 110 is below its critical thickness and the InP-based top layer 110, i.e., the channel layer, may include a strained region. For example, with a lattice-mismatch of 5%, the critical thickness is about 15 nm, and the InP-based top layer 110 preferably has a thickness less than 15 nm. In other embodiments, the thickness of the InP-based top layer 110 is greater than the critical thickness and the layer is at least partially relaxed. In an embodiment, the InP-based top layer 110 is relaxed.

In alternative embodiments, one or more layers of materials that are substantially lattice-matched to InP, such as InAlAs or InGaAs, or thin layers of non-lattice-matched III-V compounds, such as GaAs, InSb or InAs, are provided above the InP-based top layer 110 for use in forming transistor source, drain, and/or channel regions. Such thin layers of non-lattice-matched III-V compounds may be strained, which may result in enhanced performance characteristics such as improved electron and/or hole mobility. As used herein, "substantially lattice-matched to InP" means having a lattice constant difference with a lattice constant of InP of no greater than about 10%, preferably no greater than about 5%. To maintain strain in non-lattice-matched III-V compounds, such as GaAs, InSb, and InAs, the thickness of such layers is preferably less than about 10 nm.

As used herein, the term "InP-based materials" is used to refer to compositions that include or consist essentially of InP and may include additional elements. As used herein, "InP-based material layer structure" is used to refer to an InP layer or InP-based layer alone or in combination with one or more layers that are substantially lattice matched to InP or in combination with thin, strained, non-lattice-matched III-V layers.

To prevent damage to the top layer during ion implantation, such as when creating transistor source and drain regions, an encapsulation protection layer 120, i.e., a dielectric layer, is disposed on the top surface of the InP-based top layer 110. This protection layer allows implantation therethrough while preventing damage of the InP-based top layer. Examples of a suitable protection layer include a $SiO_2$ or SiN layer deposited by a CVD process, e.g., MOCVD, or an $Al_2O_3$ layer or a nanolaminate layer, including a material such as $HfO_2$ and/or HfAlO, deposited by ALD. A mask 130 is formed above the protection layer, and used to define a gate region 140, a source region 150 and a drain region 160 for a transistor. The mask forms a dummy gate structure 170, which serves as a hard mask for a subsequent ion implantation step. The mask may be formed from a suitable masking material, such as a dielectric material, e.g., $Si_3N_4$, in accordance with methods known to one of skill in the art.

The source and drain regions 150, 160 are defined in the InP-based top layer by performing an appropriate source/drain dopant ion implantation 180, using conventional techniques known to those of skill in the art, taking into account the composition of the protection layer. A channel region 190 is provided between the source and drain regions and includes at least a portion of the InP-based top layer 110, i.e., the channel layer. An anneal is then performed at a suitably high temperature to activate the implanted dopant, for example between about 600 and 900° C. with rapid thermal processing ("RTP"). The encapsulation protection layer protects the InP-based material surface during the implantation and anneal processes.

Figure 1B:
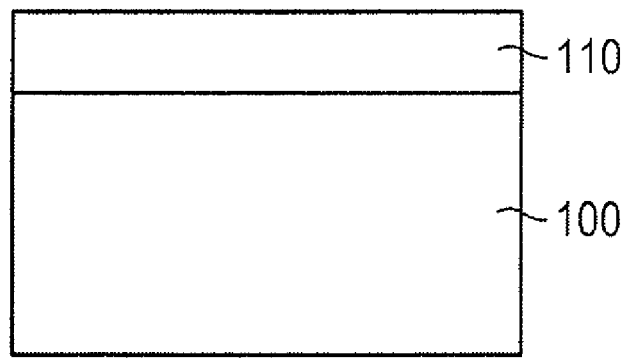

The encapsulation protection layer and the dummy gate structure may be removed after the implantation and anneal steps to create a device-ready InP-based top layer 110 as shown in FIG. 1(b). Optionally, to improve the surface quality of the InP-based top layer prior to device fabrication, a portion of its top surface may be removed to ensure the elimination of any portion that is or may be damaged. Another optional method to improve the quality of the InP-based top layer 110 is to provide an additional protective/sacrificial cap layer (not shown) on the top surface InP-based top layer 110 before forming the protection layer 120, for example, a passivation layer including one or more materials such as S, $NH_4OH$, amorphous Si, and/or amorphous Ge.

Subsequently, the surface of the InP-based top layer 110 is cleaned, and a high-quality gate dielectric layer (not shown) is deposited by, e.g., an ALD process in, for example, an ASC F-120 ALD reactor. The gate dielectric layer may be a high-k dielectric. Exemplary gate dielectric structures include, for example, a layer of $Al_2O_3$, a layer of $HfO_2$ layer, a nanolaminate layer of $HfO_2$ and $Al_2O_3$, or HfAlO, or any other suitable gate dielectric material. A post-deposition anneal (PDA) may be performed using $O_2$, $N_2$ or any other suitable ambient at an appropriate temperature, for example between about 400 and 700° C.

A gate (not shown) is formed above the channel region. At least a portion of the gate dielectric is disposed between the gate and the channel region, and the transistor operates as an inversion-type enhancement-mode device, i.e., a device that is off at a gate voltage $V_g=0$, and is on at $V_g>0$.

As is known to those skilled in the art, there has been a long-time standing Fermi-level pinning issue in fabricating III-V compound semiconductor MOSFET devices. As discussed in the context of FIG. 2, this issue is addressed in embodiments of the instant invention.

FIGS. 2(a)-(b) illustrate examples of InP MOSFETs. An InP MOSFET 200 may be formed as follows. First, an appropriately doped or semi-insulating semiconductor substrate with an InP-based channel layer is provided, i.e., an InP-based layer 110, over a substrate 100. Optionally, an additional epitaxial layer 200 may be deposited above the InP channel layer as described above for FIG. 1., e.g., by CVD, MOCVD or MBE. This additional epitaxial layer 200 may be InP and may include multiple layers of a material other than InP, such as InSb, InAs, GaAs, InAlAs, and/or InGaAs that may be substantially lattice-mismatched to InP. In order to maintain strain in the epitaxial layer 200, its thickness may be below the critical thickness.

An appropriate source and drain ion implantation is performed to create source and drain regions 150, 160 that have a conduction type opposite to that of the channel region, i.e., with n-type source and drain for a p-type channel (for an n-type inversion-type MOSFET), or with p-type source and drain for an n-type channel (for a p-type inversion-type MOSFET). For example, an appropriate p-type source and drain implantation may be a Group II element such as Mg, Be, etc., with a dosage ranging from, e.g., $4\times10^{17}/cm^3$ to $1\times10^{19}/cm^3$, with an implantation depth of, e.g., 1 nm to 1 μm. An appropriate n-type source and drain implantation may be a Group IV element, e.g., Si, Ge, etc. with a dosage ranging from, e.g., $4\times10^{17}/cm^3$ to $1\times10^{19}/cm^3$ with an implantation depth of, e.g., 1 nm to 1 μm. A target for both n-type and p-type source and drain implantations is to achieve dosage levels as high as are typically attained in Si devices. This may be a challenge in InP-based materials because n-type dopants in a III-V material may exhibit p-type behavior above a certain concentration. For example, n-type dopant Si, when present in a concentration greater than about $1\times10^{19}/cm^3$ in InP, exhibits p-type behavior. A high-quality gate dielectric 210 is formed, typically by first performing a surface-preparation step including a liquid-phase pretreatment or a gas-phase pretreatment employing, e.g., $(NH_4)_2S$ or $(NH_4)OH$, followed by surface treatment with hydrogen or nitrogen plasma, either in-situ in the same chamber, if feasible, or ex-situ. Preferably an ALD process is used to deposit a high-k dielectric layer. The gate dielectric layer may be an $Al_2O_3$ layer, an $HfO_2$ layer, a nanolaminate layer of $HfO_2$ and HfAlO, a group-II oxide, or any other dielectric material such as a rare-earth oxide or metallic oxide. The gate dielectric layer may have a thickness selected from a range of 1 nm to 1000 nm, preferably 1 nm-10 nm. The gate 220 is defined by conventional gate electrode deposition and lithographic patterning. Subsequently, source and drain ohmic contacts are formed.

FIG. 2(b) illustrates the structure of a prototype inversion-type InP MOSFET 230, integrated with a high-k dielectric deposited by ALD. The substrate 100 may be an InP semi-insulating substrate. The source and drain regions 150, 160 are defined over an Si implanted n+ region 240. The gate dielectric 210 may be formed from a high-k dielectric, such as $Al_2O_3$, $HfO_2$, or HfAlO, and/or combinations thereof. The gate 220 is formed from a suitable conducting material, such as nickel/gold.

The InP MOSFET 230 operates as an inversion-type, enhancement mode device. Because the source and drain regions are of a doping type opposite to that of the channel, e.g., n-type source and drain regions and a p-type channel, at a gate voltage $V_g=0$, the device is off, such that no current flows between the source and drain.

FIG. 2(c) summarizes the key steps for the fabrication of $Al_2O_3$/InP MOSFETs by use of ALD on an InP semi-insulating substrate, as illustrated in FIG. 2(b). Prior to the formation of the high-k gate dielectric 210, surface cleaning and preparation of the substrate 100 includes HF- or HCl-based native oxide removal, $NH_4OH$-based native oxide cleaning and OH-group passivation, and $(NH_4)_2S$ based sulfur passivation. These ex-situ wet-cleaning process steps may be extended to an in-situ gap-phase dry-cleaning process that comprises HF or HCl gas-phase cleaning, $NH_4OH$ gas-phase cleaning, and $(NH_4)_2S$ gas-phase passivation. Additionally, acetone, methanol, and iso-proponal cleaning may be performed.

After surface degreasing and $(NH_4)_2S$-based pretreatment, the substrate is transferred in a room ambient to an ALD reactor, such as an ASM F-120 ALD reactor, for gate dielectric 210 formation. The gate dielectric 210 may be, for example, an $Al_2O_3$ layer having a thickness of, e.g., 30 nm, deposited at a substrate temperature of 300° C., using alternately pulsed chemical precursors of $Al(CH_3)_3$ (the Al precursor) and $H_2O$ (the oxygen precursor) in a carrier $N_2$ gas flow.

Source and drain regions 150, 160 are selectively implanted through the 30 nm thick $Al_2O_3$ layer, e.g., with a Si dose of $1\times10^{14}$ cm$^{-2}$ at 140 keV. Implantation activation may be achieved by rapid thermal anneal (RTA), e.g., at 720° C. for 10 seconds. Regrown oxide may be etched away using BHF. A thin layer of $Al_2O_3$ or $HfO_2$ or HfAlO (e.g., 8 nm) is deposited, and a post deposition anneal is performed. Those of skill in the art are familiar with suitable alternative materials and process parameters for surface preparation and implantation and activation of source and drain regions.

The source and drain ohmic contacts may be defined by an electron beam evaporation of a combination of AuGe/Pt/Au and a lift-off process, followed by a RTA process at 500° C. for 30 seconds, also in an $N_2$ ambient.

The gate electrode may be defined by electron beam evaporation of conductive materials, such as Ni/Au, Ti/Au, AuGe/Ni/Au, and/or AuGe/Pt/Au and a lift-off process.

Referring now to FIGS. 2(d)-(j), data for an enhancement-mode n-channel InP MOSFET fabricated on a semi-insulating substrate with (ALD) $Al_2O_3$ as the gate dielectric are shown. The results illustrated in FIGS. 2(d)-(j) are for MOSFETs with nominal gate lengths varying from 0.75 µm to 40 µm and a gate width of 100 µm. Transfer-length-method (TLM) structures are used to determine contact resistance of 2.5 ohm-millimeter (Ω·mm) and sheet resistance of 230 Ω/sq. at the implanted area. Measurements are made with standard equipment such as an HP4284 LCR meter for the capacitance measurement and a Keithley 4200 for measurement of the MOSFET output characteristics.

FIG. 2(d) illustrates the drain current vs. drain bias as a function of gate bias for a 1 µm InP MOSFET with 8 nm regrown $Al_2O_3$ as gate dielectric. In particular, the figure illustrates the dc $I_{ds}$-$V_{ds}$ characteristic with a gate bias from 0 to 8 V. The measured MOSFET has a designed gate length at mask level (LMask) of 0.75 µm and a gate width ($L_w$) of 100 µm. A maximum drain current of 70 mA/mm is obtained at a gate bias of 8 V and a drain bias of 3 V. The gate leakage current is below 10 µA/mm under the same bias condition, more than 4 orders of magnitude smaller than the drain on-current. A maximum transconductance $g_m$ is approximately 10 millisiemens/mm (mS/mm) and an output conductance of approximately 3 mS/mm ($V_g=8$ V). The relatively low $g_m$ may be improved by reducing the thickness of the dielectric, increasing the dielectric constant, and improving the quality of the interface.

Figure 2E:
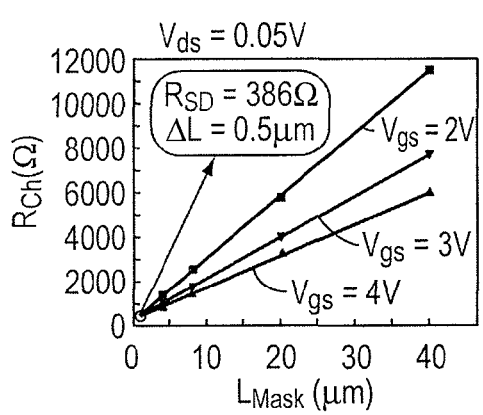

Since the fabrication process used in some embodiments is not self-aligned, accurate determination of the effective gate length and series resistance is especially important for evaluating the intrinsic device performance and the potential for further optimization. FIG. 2(e) illustrates measured channel resistance vs. mask gate length for different gate biases with $Al_2O_3$ thickness of 30 nm. Specifically, FIG. 2(e) shows the effective gate length ($L_{eff}$) and series resistance ($R_{SD}$) extracted by plotting channel resistance $R_{Ch}$ vs. $L_{Mask}$. $R_{SD}$ and ΔL, which is the difference between $L_{Mask}$ and $L_{eff}$, are determined to be 38.6 Ω·mm and 0.5 µm, respectively, by the equation below:

$$\frac{V_{ds}}{I_d} = R_{Ch} \qquad (1)$$
$$= \frac{L_{eff}}{W\mu_{eff}C_G(V_{GS}-V_T)}$$
$$= \frac{L_{Mask}-\Delta L}{W\mu_{eff}C_G(V_{GS}-V_T)}$$

The effective electron mobility $\mu_{eff}$ is weakly dependent on gate bias from 2-4 V and is taken as a constant in this calculation. $R_{SD}$ and $L_{eff}$ is determined as the intercept of the linear fitting of $R_{Ch}$ at different gate biases and $L_{mask}$ as shown in FIG. 2(e). The $R_{SD}$ value of 386Ω and the ΔL value of 0.5 µm were determined using line fitting. The obtained $R_{SD}$ is consistent with the results from measurement by a TLM technique since $R_{SD}$ includes contact resistance, sheet resistance, accumulation resistance and spread resistance. ΔL is caused by the inter-diffusion of source and drain implant activation and the proximity effect of the photolithography process.

Figure 2F:
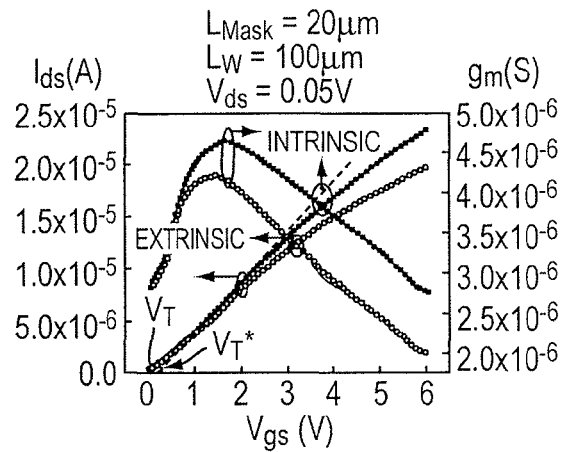

FIG. 2(f) illustrates extrinsic and intrinsic drain current and trans-conductance vs. gate bias. In particular, to evaluate the output characteristics more accurately, the intrinsic transfer characteristics is calculated by subtracting the series resistance $R_{SD}$ and using effective gate length $L_{eff}$ instead of mask gate length $L_{mask}$ and compared with the extrinsic one, as shown in FIG. 2(f). The intrinsic drain current and transconductance are only about 10% larger than the extrinsic ones due to the large gate length of 20 µm. FIG. 2(f) also shows that the subthreshold characteristic is scarcely changed. However, the threshold voltage determined by conventional method of linear region extrapolation does show some difference as highlighted as extrinsic threshold voltage $V_T$ and intrinsic threshold voltage $V_T^*$ in FIG. 2(b).

Figure 2G:
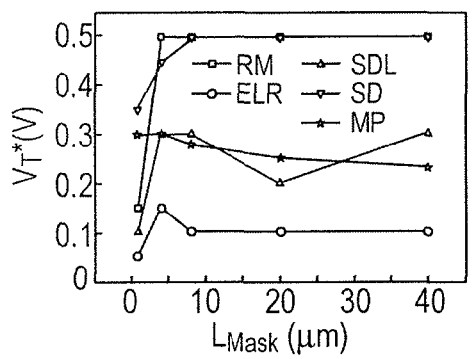

To better extract the threshold voltage, which is an important parameter in E-mode device characterization, several different methods are used to determine $V_T^*$ on various gate lengths as presented in FIG. 2(g). FIG. 2(g) illustrates threshold voltage vs. the gate length using the intrinsic I-V characteristics of the device using five different methods—the ratio method (RM), the extrapolation in the linear region method (ELR), the second derivative method (SD), the second derivative logarithmic method (SDL), and the match-point method (MP). The figure shows that the linear method may not be appropriate for determine threshold voltage for a non-self-aligned process. The second derivative method and ratio method give mostly the same value at the long gate length device and both show $V_T{}^*$ roll-off behavior for the submicron gate length device. These two methods may be more reliable ways to determine threshold voltage since the conducting mechanism changes during the transition near threshold, when drain current increases from exponentially to linear or quadratic dependence on the effective gate voltage ($V_g$-$V_T$).

Figure 2H:
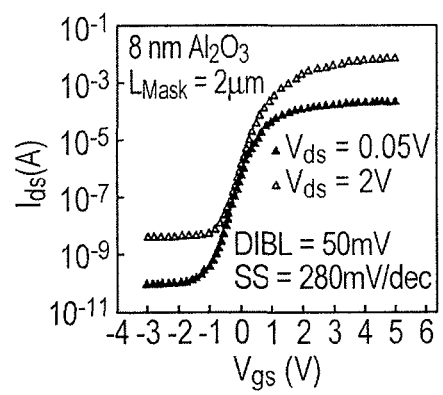

FIG. 2(h) illustrates drain current vs. drain bias as a function of gate bias for a 2 μm InP MOSFET with 8 nm $Al_2O_3$ gate oxide. In particular, the sub-threshold slope (S.S>) and DIBL characteristics of 280 mV/dec and 50 mV for the MOSFET are illustrated.

Figure 2I:
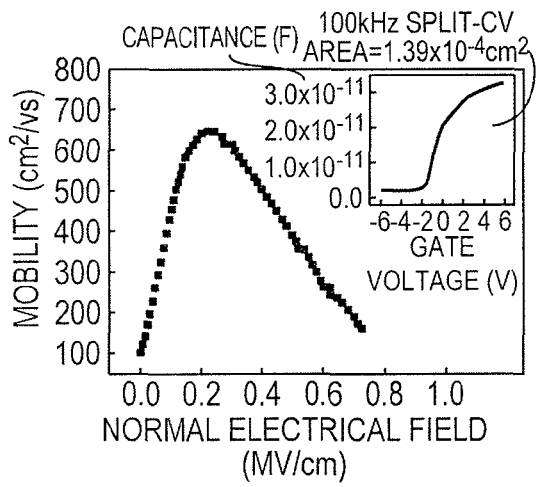

FIG. 2(i) illustrates effective mobility vs. normal electric field for the InP MOSFET with 30 nm $Al_2O_3$ gate oxide and a 100 kHz split-CV measurement. Effective mobility is another important parameter for evaluating MOSFET performance. The "Split-CV" method is used to measure the channel capacitance, which may be used to calculate the total inversion charge in the channel by integrating the C-V curve. The inset of FIG. 2(i) is a 100 kHz C-V curve between gate and channel measured on a 40 μm gate length device from which inversion capacitance is seen clearly. The extracted mobility has a peak value of 650 $cm^2$/Vs around a normal electric field of 0.22 MV/cm as shown in FIG. 2(i). Better mobility performance may be achievable by using an epitaxial InP layer to improve host material quality and optimize the device fabrication process.

Figure 2J:
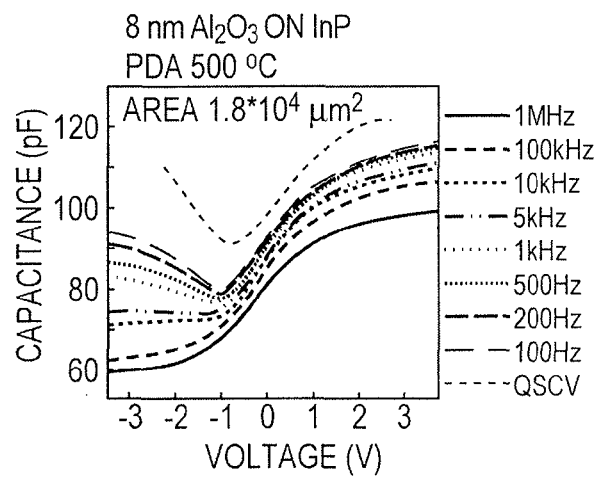

Detailed C-V measurements of MOS capacitors were carried out to evaluate the interface quality of $Al_2O_3$ formed by ALD on InP. FIG. 2(j) illustrates C-V measurements of an 8 nm $Al_2O_3$/n-InP MOSCAP from quasi-static up to 1 MHz.

Specifically, the samples include 8 nm thick $Al_2O_3$ deposited on an n-type InP substrate at 300° C. by ALD. A 500° C. post deposition annealing improves C-V characteristics only moderately for InP as shown in FIG. 2(j), in contrast to the GaAs case. The frequency dispersion at accumulation capacitance may be attributed to the relative high interface trap density ($D_{it}$) at the conduction band edge, though the extrinsic parasitic effects could also contribute to the frequency dispersion partly. The mid-gap $D_{it}$ is estimated to be approximately 2-3×$10^{12}$/$cm^2$-eV determined by the high-frequency (HF)–low-frequency (LF) method. This value is consistent with the value determined from the m-factor, a parameter related to sub-threshold characteristics. More specifically, the subthreshold slope is relatively large due to the large gate oxide thickness or the small oxide capacitance $C_{ox}$ and the existing interface trap capacitance $C_{it}$. M-factor is defined as 60 mV/dec.×(1+$C_{it}$/$C_{ox}$). From the measured sub-threshold slope, an interface trap density $D_{it}$ of ~2-3×$10^{12}$/$cm^2$-eV is determined.

Moderate hysteresis of 100-300 mV exhibits in the C-V loops (not shown). The C-V characteristics in FIG. 2(j) show a clear transition from accumulation to depletion for HF C-V and the inversion features for LF C-V and quasi-static C-V indicating that the conventional Fermi-level pinning phenomenon reported in the literature is overcome in this ALD $Al_2O_3$/InP sample. The unpinning of the Fermi level may be attributed to the self-cleaning ALD $Al_2O_3$ process that removes the native oxide on the InP surface, similarly to the situation in ALD $Al_2O_3$ formed on GaAs. The unpinning of the Fermi level by the ALD $Al_2O_3$ process described above is significant, as it contributes to the realization of enhancement-mode MOSFETs on InP, as demonstrated in FIG. 2(d).

The ALD process on III-V compound semiconductors enables the formation of high-quality gate dielectrics and unpinning of the Fermi level on compound semiconductors. A 0.75-μm gate-length E-mode n-channel MOSFET with an $Al_2O_3$ gate oxide thickness of 30 nm may have a gate leakage current less than 10 μA/mm at a gate bias of 8 V, a maximum drain current of 70 mA/mm, and a transconductance of 10 mS/mm. The peak effective mobility is ~650 $cm^2$/Vs and the interface trap density of $Al_2O_3$/InP is estimated to be ~2-3×$10^{12}$/$cm^2$ eV.

The prototype measurements reflected in FIGS. 2(d)-(j) reflect the use of $Al_2O_3$ as the gate dielectric. Alternatively other materials, such as Hf-based high-k materials, can be used for the gate dielectric. An exemplary process for formation of $HfO_2$ as a dielectric by using ALD is to use ALD precursors such as $HfCl_4$, TEMAHf or TDMAHf and oxygen precursors such as $H_2O$ or $O_3$. A typical $HfO_2$ ALD process is performed between 200-350° C. Surface cleaning and preparation is similar with use of materials such as HF, HCl, $NH_4OH$ and $(NH_4)_2S$.

For InP devices, such as the examples of FIGS. 2(a)-(j), the substrate may be a semi-insulating InP substrate or alternatively may be another material that supports an InP channel device. For example, a Si or SOI substrate, can provide cost and manufacturing advantages because of the possibility of using large-scale wafers and the well-developed Si-based processing facilities.

InP-based devices may be integrated on Si substrates by the use of aspect ratio trapping (ART) techniques. Two exemplary approaches for such integration using ART techniques are illustrated in FIGS. 3(a)-(d). A detailed description of ART techniques may be found in U.S. patent application Ser. No. 11/728,032, incorporated herein in its entirety.

Figure 3A:
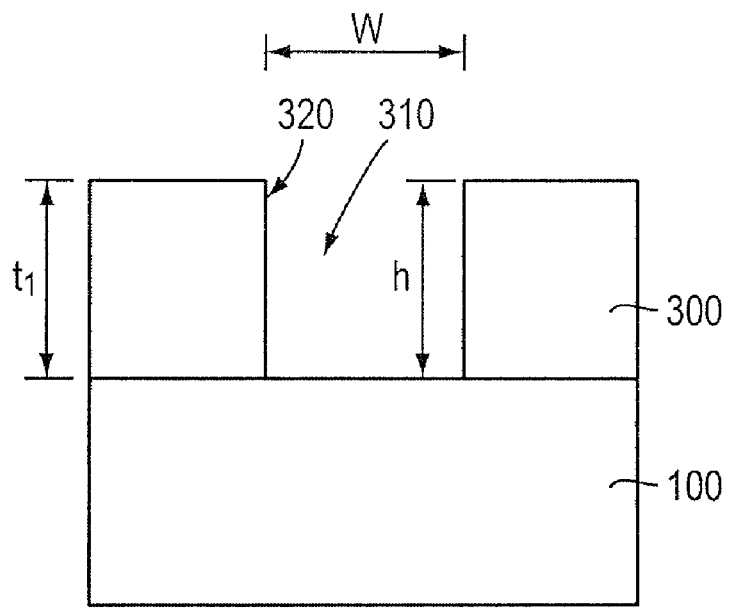
FIGS. 3(a)-(d) are schematic cross-sectional views illustrating the fabrication of InP-based devices on lattice-mismatched substrates such as silicon, in accordance with an embodiment of the invention.
Figure 3B:
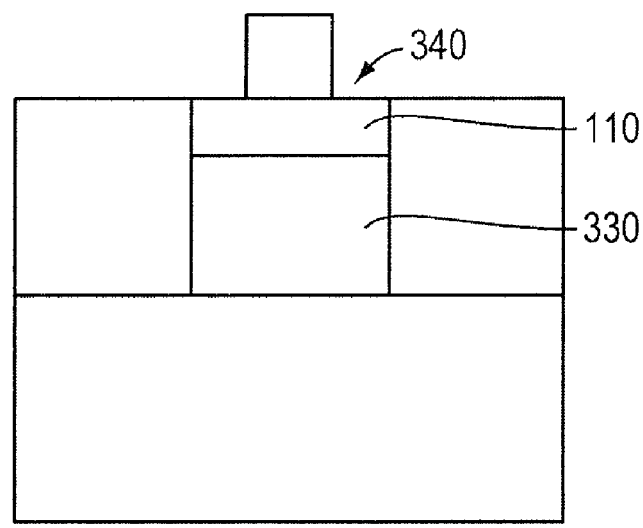

FIGS. 3(a)-3(b) show how ART techniques may be used to grow a high-quality InP layer above a buffer layer on a lattice-mismatched underlying material, such as a Si wafer. The crystalline substrate may have a lattice constant substantially different from a lattice consant of InP. As illustrated in FIG. 3(a), a non-crystalline material, e.g., a dielectric layer 300, is formed over the substrate 100. The dielectric layer 300 may include a dielectric material, such as silicon nitride or silicon dioxide. The dielectric layer 300 may be formed by a method known to one of skill in the art, e.g., thermal oxidation or plasma-enhanced chemical vapor deposition. As illustrated, the dielectric layer 300 has a thickness $t_1$ corresponding to a desired height of crystalline material to be deposited in a window 310 formed through the dielectric layer 300. In some embodiments, the thickness $t_1$ of the dielectric layer 300 is selected from a range of, e.g., 20-50000 nm.

A mask (not shown), such as a photoresist mask, is formed over the substrate 100 and the dielectric layer 300. The mask is patterned to expose at least a portion of the dielectric layer 300. The exposed portion of the dielectric layer 300 is removed by, e.g., reactive ion etching (RIE) to define the window 310 in the non-crystalline mask, i.e., in the dielectric layer 300. The window 310 extends to a surface of the substrate 100 and may be defined by at least one sidewall 320. The sidewall 320 is formed from the dielectric layer 300 and is, therefore, non-crystalline. The sidewall 320 may have a height h at least equal to a predetermined distance H from the surface of the substrate 100, i.e., the sidewall extends above the substrate by the height h. It has been observed experimentally that dislocations in a mismatched cubic semiconductor grown on a Si (100) surface in the near-vicinity (e.g., within approximately 500 nm or less) of a vertical dielectric sidewall 420 surface bend toward that surface at approximately 30 degrees through 60 degrees. For example, the dislocations may bend toward that surface at approximately a 45 degree angle to that surface. Based on this relationship, one may typically expect the predetermined distance H necessary to trap defects to be approximately equal to a width between ½ w and 2w, where w is the width of the window.

The window 310 may be substantially rectangular in terms of cross-sectional profile, a top view, or both, and have a width w that is smaller than a length l (not shown) of the window. For example, the width w of the window may be less than about 5000 nm, e.g., about 20-1000 nm. In some embodiments, the width of the window is about 150 nm. A length l of the window may exceed each of w and H. The ratio of the height h of the window to the width w of the window may be $\geq 1$, and preferably is between about 1 and about 50.

A crystalline buffer layer 330 including a material, such as Ge or InP, that has a lattice mismatch with the substrate 100 material, e.g., Si, is epitaxially grown within the opening 310. By configuring the aspect ratio of the height of the mask relative to the width of the opening, defects arising from deposition of the buffer layer may exit at the sidewalls below the top surface of the mask layer. This provides a high-quality top surface of the buffer layer 330 upon which the InP-based top layer 110 may be grown epitaxially.

In particular, the buffer layer 330 may include a second crystalline semiconductor material that may include or consist essentially of a group IV element or compound, a III-V compound, and/or a II-VI compound. Examples of suitable group IV elements or compounds include germanium, silicon germanium, and silicon carbide. Examples of suitable III-V compounds include gallium arsenide, gallium nitride, indium arsenide, indium antimonide, indium aluminum antimonide, indium aluminum arsenide, indium phosphide, and indium gallium arsenide. Examples of suitable II-VI compounds include zinc selenide and zinc oxide. The buffer layer 330 is lattice-matched to the InP-based top layer 110 formed thereover, i.e., the buffer layer 330 may have a second lattice constant substantially similar to the lattice constant of InP.

The second crystalline semiconductor material may be formed by selective epitaxial growth in any suitable epitaxial deposition system, including, but not limited to, MOCVD, atmospheric-pressure CVD (APCVD), low- (or reduced-) pressure CVD (LPCVD), ultra-high-vacuum CVD (UH-CVD), MBE, or ALD. In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 900° C., depending on the composition of the epitaxial region. The growth system may also utilize low-energy plasma to enhance the layer growth kinetics. CVD has a number of advantages, including the capability for depositing films with low defect densities and rapidly varying alloy compositions, as well as high quality regrowth capability. CVD may also provide improved manufacturability due to relatively higher throughput, relatively short downtimes, and scalability to very large reactors.

The epitaxial growth system may be a single-wafer reactor or a multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Dislocation defects in the second crystalline semiconductor material reach and terminate at the sidewalls 320 of the window in the dielectric material 300 at or below a vertical predetermined distance H from the surface of the substrate, such that dislocations in the second crystalline semiconductor material decrease in density with increasing distance from the bottom portion of the window. Accordingly, the upper portion of the buffer layer 330 is substantially exhausted of dislocation defects. Various dislocation defects such as threading dislocations, stacking faults, twin boundaries, or anti-phase boundaries may thus be substantially eliminated from the upper portion of the epitaxial region. A density of such dislocation defects may be less than, for example, $10^6/cm^2$, preferably less than $10^3/cm^2$. The second crystalline semiconductor material may be either substantially relaxed or strained.

The InP-based top layer 110, i.e., the channel layer, is formed over the buffer layer 330, the channel layer being substantially lattice-matched with the buffer layer. After using ART techniques to provide a high-quality InP-based top layer 110, the techniques as described above in connection with FIGS. 1 and 2 may be used to create a device 340, such as a transistor, which incorporates the InP-based top layer, preferably as a channel. The source and drain regions of the transistor may also be formed in the channel layer, and a gate formed above the channel layer.

Although using a Si substrate provides cost and manufacturability advantages, ART techniques may be used with a variety of substrate and mask materials. As discussed in U.S. Ser. No. 11/728,032, the opening may be configured in a variety of ways based on materials and applications, such as in a trench configuration.

Figure 3C:
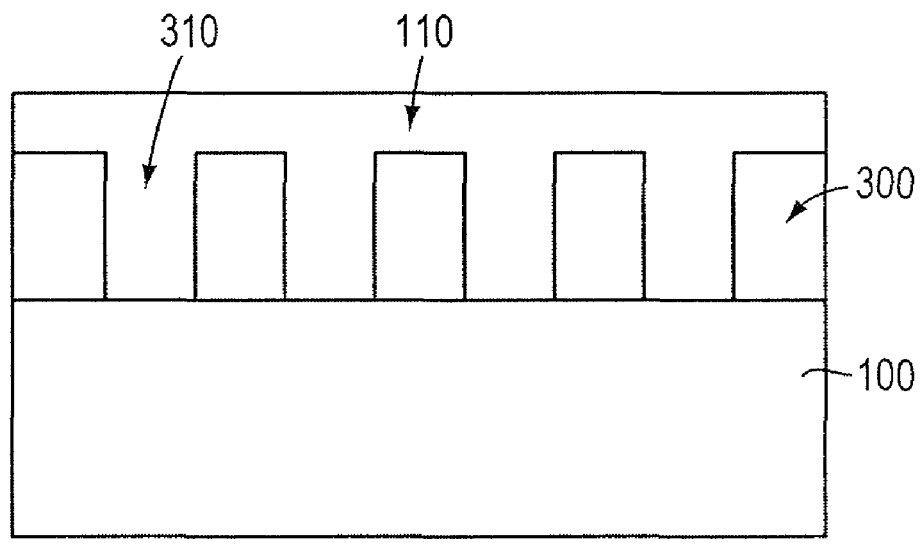
Figure 3D:
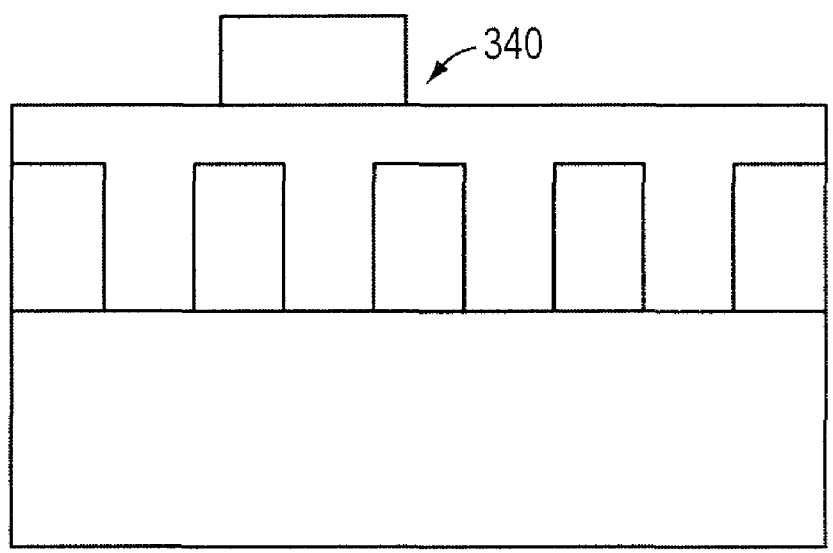

Referring now to FIGS. 3(c)-(d), an alternative ART approach for providing an InP-based channel layer is described. The mask 300 defines a plurality of openings 310 above substrate 100. An InP-based material, such as InP, is epitaxially grown within the openings, which are configured with an aspect ratio so that the majority of defects arising from the lattice mismatch between the underlying substrate, e.g., Si and InP, exit the InP-based layer at the mask sidewalls within the openings. The InP-based material is epitaxially grown to extend above the mask 300 to define a high quality coalesced InP-based top layer 110, upon which InP-based devices 340, such as the MOSFETs described above with reference to FIGS. 1 and 2, may be fabricated.

Figure 4A:
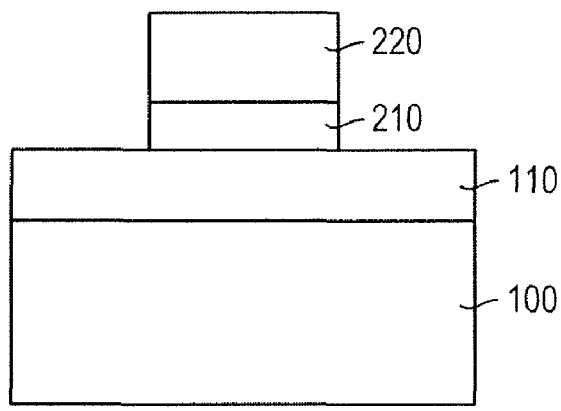
FIGS. 4(a)-(c) are schematic cross sectional views illustrating fabrication of an enhancement-type InP MOSFET, in accordance with an embodiment of the invention.

Creation and activation of the source and drain may be a challenging step in forming transistors such as an inversion-type InP MOSFET. An alternative to the implanted source/drain formation approach discussed above uses a replacement source/drain structure. Referring to FIG. 4(a), a semiconductor substrate 100 with an InP-based top channel layer 110 is provided, with predefined channel doping type and doping level. The channel may be, for example, p-type doped with a doping level of $1\times10^{18}/cm^3$ to $1\times10^{19}/cm^3$. For a III-V material such as InP, a suitable n-type dopant is a Group IV element, such as Si. A suitable p-type is a Group II element, such as Mg. A relatively high doping level is preferred for enabling the low contact resistances. It is a challenge, however, to dope InP and other III-V materials to a level greater than $1\times10^{20}/cm^3$.

A gate dielectric 210 is deposited on the InP channel material according to the methods described above, for example using ALD to deposit a dielectric material such as $Al_2O_3$. The dielectric material may include hafnium, e.g, $HfO_2$. Thereafter, a conductive layer, e.g., a gate electrode layer is formed over the gate dielectric, such that the dielectric layer is disposed between a semiconductor layer, i.e., the InP-based top channel layer 110, and the conductive layer. A gate 220 is defined in the conductive layer by patterning methods known to one of skill in the art.

Figure 4B:
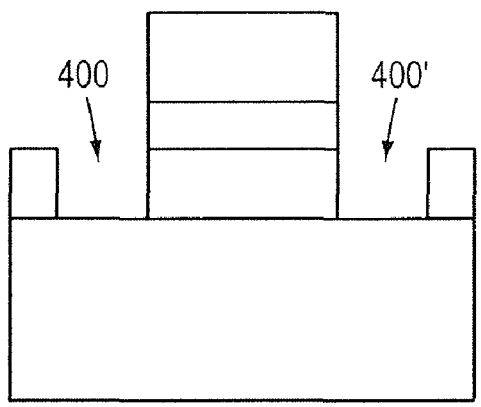
Figure 4C:
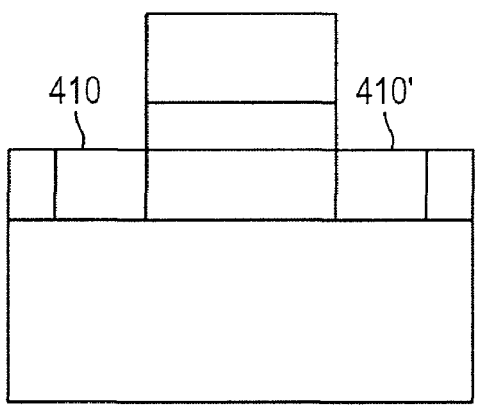

Using techniques known to those familiar with the art, a source region and a drain region are patterned in a lithographic mask next to the gate structure, and the portions of the InP-based top layer 110 in the source and drain regions are removed by, e.g., dry etching, to form source and drain recesses 400, 400', as shown in FIG. 4(*b*). The source and drain recesses 400, 400' are filled with an appropriate source/drain material 410 that has a doping type opposite to that of the channel region, as shown in FIG. 4(*c*). In an embodiment, InP may be grown epitaxially within the source and drain recesses 400, 400' by CVD with doping performed in situ. With a p-type channel dopant, an n-type dopant may be used for the source and drain to create an n-MOSFET. The doping types are reversed for a p-MOSFET. Those of skill in the art understand how to use appropriate dopants and materials to achieve the desired device characteristics.

This approach, including the regrowth of the source and drain in the recesses, may allow the achievement of higher doping concentrations in the source and drain regions, and may enable lower contact resistances. The MOSFET structure illustrated in FIG. 4*c* may be an inversion-type, enhancement-mode device. As discussed previously, at Vg=0, a pn-junction blockades the drain current in the channel so that the device is off. At Vg>0, the InP-based channel under the gate is inverted to become n-type, so the device is on with a large drain current.

Figure 5:
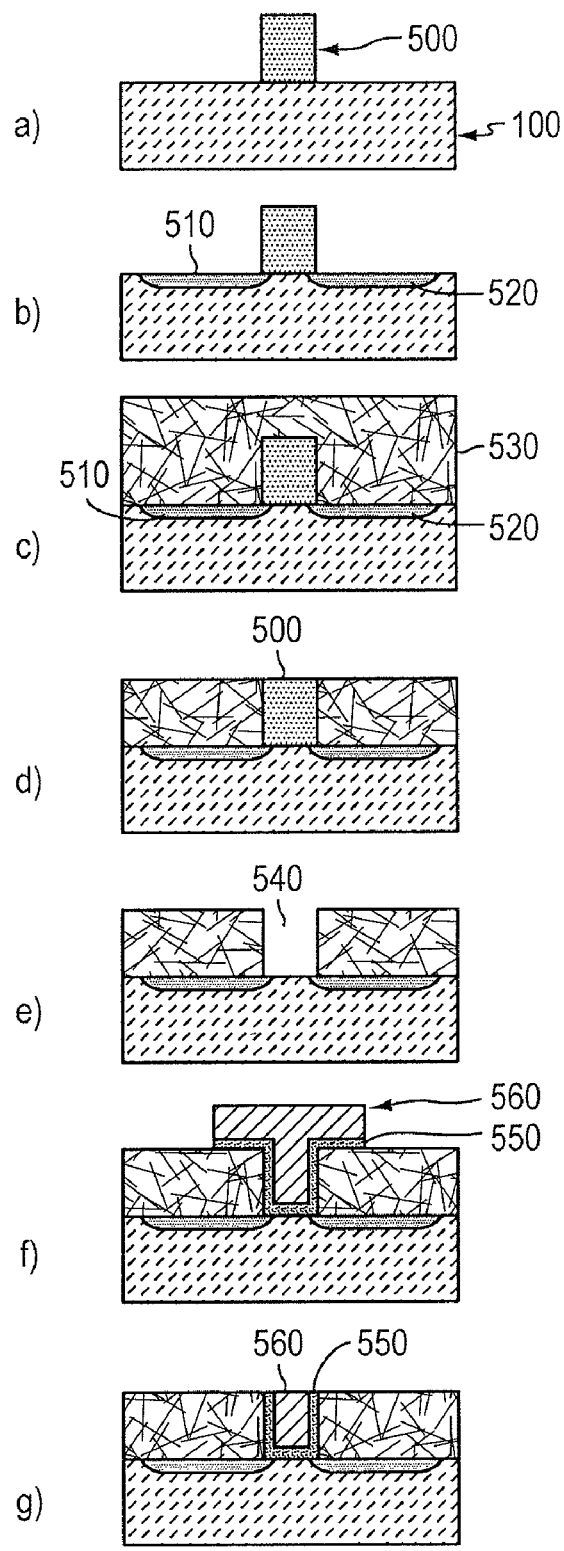
FIGS. 5(a)-(g) are schematic cross-sectional views illustrating a method of making a self-aligned gate structure for an InP-based MOSFET, according to an embodiment of the invention.

FIGS. 5(*a*)-(*g*) illustrate a method of creating a MOSFET with source and drain regions that are self-aligned to the gate, i.e., the edges of the source and drain regions next to the gate are defined by the same mask that defines the edges of the gate next to the source and drain regions. Referring to FIG. 5(*a*), a mask 500 defines the locations of the gate and channel locations over a substrate 100. The mask 500 functions as a dummy gate and also as a barrier to ion implantation in the channel region during creation of the source and drain regions 510, 520 by ion implantation, as shown in FIG. 5(*b*). The mask may be made from an appropriate material, such as photoresist. After ion implantation of the source and drain regions, an insulator 530 such as SiN is deposited over the mask 500 and source and drain regions 510, 520, and is then etched back to expose a top surface of the mask 500 (i.e., of the dummy gate) as shown in FIGS. 5(*c*)-5(*d*). Referring to FIG. 5(*e*), the dummy gate is then removed by a selective etch, e.g., by a wet etch such as KOH or TMAH, or a dry etch in a reactive ion etching system, to define an opening 540. A gate dielectric 550 and gate material layers 560 are deposited into the opening created by the removal of the dummy gate, and etched back as shown in FIGS. 5(*f*)-(*g*). Advantageously, this self-aligned gate procedure enables the use of InP as a channel material and ALD for depositing a high-k gate dielectric while maintaining small (sub-micron) feature sizes and spacing. Forming a dummy gate enables the formation of a self-aligned gate, without exposure of the device gate dielectric and gate electrode to a high temperature dopant activation process that may damage a high-k dielectric. The dummy gate approach includes forming a gate dielectric after a source/drain implantation and activation, rather than before these steps, as in a conventional process flow.

Figure 6:
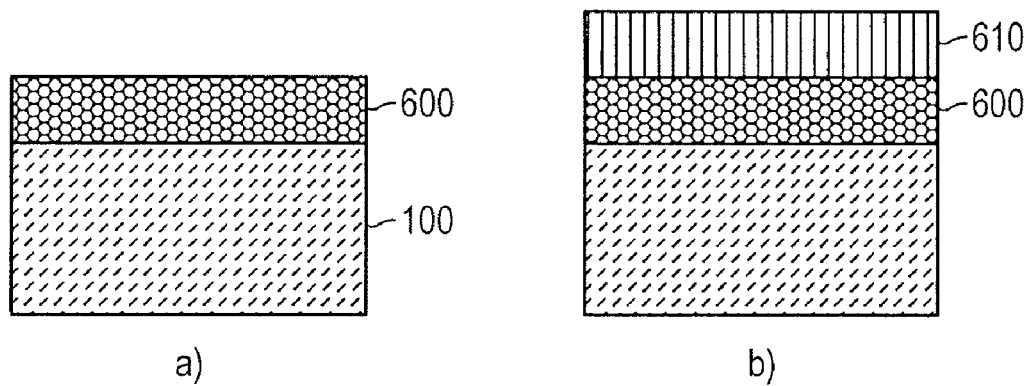
FIGS. 6(a)-(b) are schematic cross-sectional views illustrating dielectric layers deposited on an InP substrate.

InP is a binary compound semiconductor resulting from a relatively weak covalent bond between indium and phosphorous. While InP MOSFETs feature characteristics such as enhanced drain currents and improved performance with respect to Fermi-level pinning and higher electron saturation velocity, the relatively strong electropositivity of indium can be a disadvantage, resulting, for example, in the relatively high reactivity of InP with oxygen. Thus, for example, as shown in FIGS. 6(*a*)-6(*b*), to mitigate interfacial instability difficulties between InP and dielectric materials as well as to prevent incongruent sublimation of the III-V material InP, it is possible to use a diffusion/barrier layer 600 including a relatively inert materials such as transition metal nitrides or group III-nitrides (e.g., BN, AlN, MoN, TaN, TiN, or AlN, etc., which are much less reactive with InP than oxygen, especially at higher temperatures) adjacent the top surface of the InP-based top layer 110 of substrate 100. As shown in FIG. 6(*b*), the use of a relatively inert diffusion/barrier layer 600 permits the sequential deposition of a relatively non-inert dielectric 610 such as $SiO_2$ or $Al_2O_3$ above the relatively inert layer. By use of ALD, the inert barrier layer 600 may be kept relatively thin, e.g., as thin as one monolayer (which typically will be about 15 angstroms (Å)), or preferably about 5 to 10 nanometers (nm), although the barrier layer can be substantially thicker, e.g., as thick as 1 μm or more. In alternative embodiments, the barrier layer may be AlN or AlON or a nanolaminate—e.g., alternating layers of AlN and $Al_2O_3$, deposited as monolayers or in layers of about 5 nm—which can enhance the ability of the barrier layer to trap materials such as In or P before they can diffuse through the barrier layer.

Figure 7:
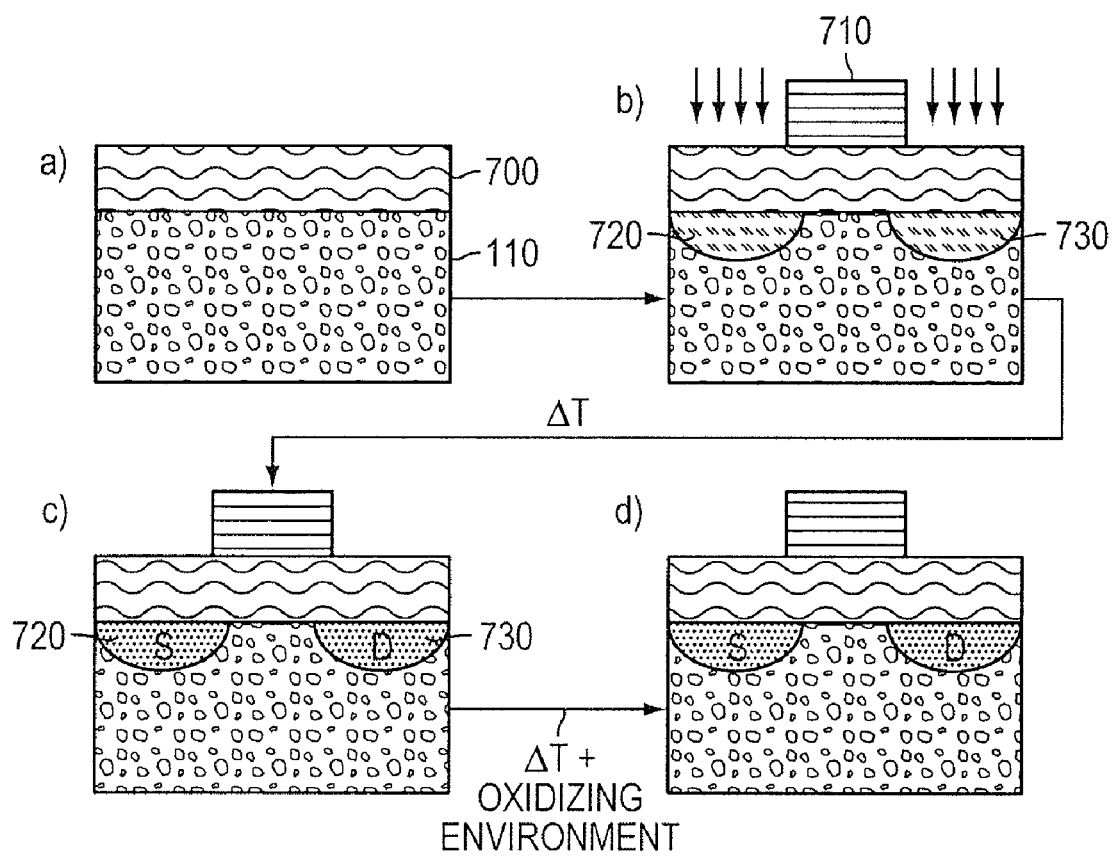
FIGS. 7(a)-(d) are schematic cross sectional views illustrating a method of implantation and amorphization of source and drain regions through a diffusion/barrier layer and subsequent recrystallization of the source and drain regions and oxidation to improve the layer's dielectric properties.

FIGS. 7(*a*)-(*d*) illustrate a method of forming source and drain regions that also provides for an improved dielectric layer, e.g., an improved gate dielectric layer. In FIG. 7(*a*) a dielectric 700 inert to InP, such as a transition metal-nitride, is provided above an InP-based top layer 110 using ALD as described above for FIG. 6. In FIG. 7(*b*) the gate 710 is defined and the source and drain regions 720, 730 of a transistor are implanted using techniques similar to those discussed above for FIGS. 1 and 2, and the source and drain regions are amorphized. In an embodiment, amorphization is accomplished by using a heavy dopant species such as $SiF_x$, with sufficient dopant dosage and energy to concomitantly accomplish both amorphization and high dopant concentration of the source/drain regions. In another embodiment, amorphization is accomplished by implanting an inert element such as argon or another suitable noble gas prior to the implantation of the dopant species. In still another embodiment, amorphization is accomplished by using a heavy dopant species such as $SiF_x$, with sufficient dopant dosage and energy to concomitantly accomplish amorphization of and high dopant concentration in the source/drain regions. For example, complete amorphization of the InP lattice may be accomplished through the use of high dosage implants using compounds such as $SiF_x$ between $10^{14}$ $cm^{-2}$ and $10^{16}$ $cm^{-2}$ through dielectric layer(s). Easy displacement of the In sublattice along <0001> directions can enable amorphization through heavy dosage implantation.

In FIG. 7(*c*) the source/drain regions 720, 730 are annealed at a temperature sufficiently high to ensure recrystallization, such as by RTA between 400° C. and 1000° C. Use of high implantation dosages and improved activation/ionization of the dopant species through recrystallization of the amorphized InP lattice lowers the contact resistance. Then in FIG. 7(*d*) an oxidizing species, e.g., PECVD $SiO_2$, is introduced at a temperature of, e.g., 300° C., to enable formation of an oxynitride from the dielectric 700, e.g., from a dielectric transition metal nitride. Converting the dielectric transition metal nitride into an oxynitride provides an improved dielectric from the same layer that provided an effective diffusion barrier, eliminating the need to deposit new dielectric material. Effective performance of the transistor embodiment of FIG. 7 is enhanced by the use of ohmic contacts.

In some embodiments, processes and materials analogous to the methods described above may be used to form a high electron mobility transistor (HEMT) including an InP-based material. A HEMT is a field effect transistor incorporating a junction between two materials with different band gaps (i.e., a heterojunction) as the channel instead of a doped region. An InP-based material may be incorporated in a HEMT as a portion of the channel layer.

The embodiments disclosed above and their variations address a variety of challenges in providing enhanced MOSFET performance in a commercially viable way through various combinations of materials and techniques such as InP-based, ALD, and $Al_2O_3$ or Hf-based dielectrics in conjunction with various other features and steps. Those skilled in the art will understand how to substitute other materials and process steps to apply these inventive combinations to a variety of applications.

What is claimed is:

1. A method of fabricating a transistor, the method comprising:
    providing a crystalline substrate having a first lattice constant substantially different from a lattice constant of InP;
    providing a non-crystalline mask above the substrate, the mask including an opening having sidewalls that extend above the substrate by a height;
    providing within the opening a crystalline buffer layer having a second lattice constant substantially lattice-matched to InP, the buffer layer having a height less than the mask opening sidewall height, the buffer layer height being sufficient to permit defects arising from the lattice mismatch to exit the buffer layer at the mask opening sidewalls;
    providing a channel layer above the buffer layer, a portion of the channel layer being lower than a top surface of the mask, the channel layer comprising a crystalline material, the crystalline material comprising an InP-based material;
    defining a source region, a drain region, and a channel region of a transistor in the channel layer; and
    providing a gate above the channel layer.

2. The method of claim 1 wherein the substrate is a silicon substrate.

3. The method of claim 1 wherein the mask comprises $SiO_2$.

4. The method of claim 1 wherein the buffer layer comprises a III-V material.

5. The method of claim 1 wherein the buffer layer comprises InP.

6. The method of claim 1, wherein the source region and the drain region are defined in the InP-based material, the channel region being defined between the source region and the drain region, the gate being provided above the channel region, and further comprising depositing a gate dielectric over the channel region by atomic layer deposition (ALD), wherein at least a portion of the gate dielectric is disposed between the gate and the channel region and the transistor operates as an inversion-type, enhancement-mode device.

7. The method of claim 6 wherein the gate dielectric comprises at least one of a group II material or a transition metal.

8. The method of claim 7 wherein the gate dielectric comprises aluminum.

9. The method of claim 7 wherein the gate dielectric comprises hafnium.

10. The method of claim 1 wherein the source and drain regions are further disposed above the channel layer.

11. The method of claim 1 wherein the channel layer comprises a strained region.

12. The method of claim 1 wherein the channel layer comprises at least one of InSb, InGaAs, or InAs.

13. The method of claim 1 wherein the channel layer comprises a plurality of substantially lattice-matched layers.

14. The method of claim 1 wherein the transistor is a MOSFET.

15. The method of claim 1 wherein the transistor is a HEMT.

16. The method of claim 1, wherein the providing the gate comprises:
    depositing by ALD, above at least a portion of the channel layer, a dielectric layer comprising hafnium; and
    providing a conductive layer over at least a portion of the dielectric layer, wherein the dielectric layer is disposed between the channel layer and the conductive layer.

* * * * *